United States Patent
Killen, Jr. et al.

(10) Patent No.: US 12,132,670 B2
(45) Date of Patent: Oct. 29, 2024

(54) DIS-AGGREGATED SWITCHING AND PROTOCOL CONFIGURABLE INPUT/OUTPUT MODULE

(71) Applicant: Sanmina Corporation, San Jose, CA (US)

(72) Inventors: Odie Banks Killen, Jr., Colorado Springs, CO (US); Charles C. Hill, Colorado Springs, CO (US); Ritesh Kumar, Colorado Springs, CO (US)

(73) Assignee: Sanmina Corporation, San Jose, CA (US)

( * ) Notice: Subject to any disclaimer, the term of this patent is extended or adjusted under 35 U.S.C. 154(b) by 362 days.

(21) Appl. No.: 17/515,004

(22) Filed: Oct. 29, 2021

(65) Prior Publication Data

US 2023/0137940 A1  May 4, 2023

(51) Int. Cl.
*H04L 49/253* (2022.01)
*H04L 49/00* (2022.01)
*H04L 49/25* (2022.01)
*H05K 5/02* (2006.01)

(52) U.S. Cl.
CPC .......... *H04L 49/254* (2013.01); *H04L 49/256* (2013.01); *H04L 49/30* (2013.01); *H05K 5/0204* (2013.01)

(58) Field of Classification Search
CPC ..... H05K 5/0204; G06F 3/061; G06F 3/0604; G06F 3/0658; G06F 3/067; G06F 13/1694; G06F 13/4022; G06F 13/4027; G06F 13/387; H04L 49/254; H04L 49/256; H04L 49/30

See application file for complete search history.

(56) References Cited

U.S. PATENT DOCUMENTS

| | | | |
|---|---|---|---|
| 7,274,660 B2 | 9/2007 | Hill et al. | |
| 7,295,519 B2 | 11/2007 | Sandy et al. | |
| 7,702,962 B2 * | 4/2010 | Numanoi | G06F 11/0727 714/26 |

(Continued)

FOREIGN PATENT DOCUMENTS

EP    4092995 A2    11/2022

OTHER PUBLICATIONS

Corresponding EP Application No. 22204826. Extended Search Report (Mar. 3, 2023).

*Primary Examiner* — Charles C Jiang
*Assistant Examiner* — Rachel Elizabeth Marks
(74) *Attorney, Agent, or Firm* — Julio Loza; LOZA & LOZA, LLP

(57) ABSTRACT

An input/output module (IOM) for use within a network storage system mounted within a rack enclosure. The IOM includes a switching component configured to provide top-of-rack (TOR) switching for data to be routed from input connectors to data storage devices within the rack enclosure. The IOM also includes a protocol interface configured to convert a protocol of the data from an input data protocol (e.g., Ethernet, Fibre Channel or InfiniBand™) to a protocol for use with the storage devices (e.g., nonvolatile memory express (NVMe) and Peripheral Component Interconnect Express (PCIe)). Among other features, the IOM allows switching to be dis-aggregated from a TOR switch and distributed throughout the data network of the rack.

16 Claims, 21 Drawing Sheets

(56) References Cited

U.S. PATENT DOCUMENTS

| | | | |
|---|---|---|---|
| 8,366,464 B1* | 2/2013 | Figuerado | G06F 1/185 |
| | | | 439/160 |
| 10,162,793 B1* | 12/2018 | Bshara | H04L 69/16 |
| 2011/0219163 A1* | 9/2011 | Beadnell | G06F 13/36 |
| | | | 710/315 |
| 2012/0207165 A1* | 8/2012 | Davis | G06F 15/167 |
| | | | 370/392 |
| 2019/0045634 A1* | 2/2019 | Hill | H05K 1/141 |
| 2019/0187909 A1* | 6/2019 | Pinto | H04L 49/351 |
| 2020/0159449 A1* | 5/2020 | Davis | G06F 3/0604 |
| 2021/0027313 A1* | 1/2021 | Koch | G06Q 30/0201 |

* cited by examiner

Input/Output Module (IOM) for use within a network storage system — 2000

2002 — First switching component configured to receive input data from a plurality of input connectors for routing to a plurality of storage devices of the network storage system and further configured to determine particular bridge components from among a plurality of bridge components to receive particular portions of the input data 2004 — A plurality of bridge components configured to receive data from the first switching component in a first protocol and convert the data to a second protocol for use with particular storage devices of the plurality of storage devices 2006 — At least one second switching component configured to receive data in the second protocol from at least one of the plurality of bridge components for routing to particular storage devices among the plurality of storage devices

FIG. 20

DIS-AGGREGATED SWITCHING AND PROTOCOL CONFIGURABLE INPUT/OUTPUT MODULE

FIELD

This application relates to computer network switching and storage systems and, in particular, to input/output modules for use in rack-based network storage systems.

BACKGROUND

Storage architectures for network storage systems often employ "top-of-rack" (TOR) switches, such as TOR Ethernet, Fibre Channel or InfiniBand switches. (InfiniBand is a trademark of System I/O, Inc.) The TOR switches can be expensive and consume rack space within the rack enclosure of the system. As such, there is a need for improved switching and storage system architectures, particularly, but not exclusively, for use with Ethernet, Fibre Channel or InfiniBand.

SUMMARY

According to a first aspect, an input/output module (IOM) is provided that is configured for insertion into a mounting slot of a rack enclosure of a network storage system. The IOM includes: a first switching component configured to receive input data from a plurality of input connectors for routing to a plurality of storage devices of the network storage system; a plurality of bridge components configured to receive data from the first switching component in a first protocol and to convert the data to a second protocol for use with particular storage devices of the plurality of storage devices; wherein the first switching component is configured to determine particular bridge components from among the plurality of bridge components to receive particular portions of the input data; and at least one second switching component configured to receive data in the second protocol from at least one of the plurality of bridge components for routing to particular storage devices among the plurality of storage devices.

According to another aspect, a method is provided for use with an IOM for insertion into a mounting slot of a rack enclosure of a network storage system. The method includes: routing data through a first switching component configured to receive input data in a first protocol from a plurality of input connectors for routing to a plurality of storage devices of the network storage system; determining particular bridge components from among a plurality of bridge components to receive particular portions of the input data; routing the particular portions of the input data through at least one of the plurality of bridge components to convert the input data to a second protocol for use with particular storage devices of the plurality of storage devices; and routing the data in the second protocol through at least one second switching component for sending to particular storage devices among the plurality of storage devices.

According to still another aspect, an apparatus is provided for insertion into a mounting slot of a rack enclosure of a network storage system. The apparatus includes: means for receiving input data in a first protocol from a plurality of input connectors and determining particular means for bridging of the apparatus from among a plurality of means for bridging of the apparatus to receive particular portions of the input data; wherein at least one of the means for bridging is configured for converting the data to a second protocol for use with particular storage devices of a plurality of storage devices of the network storage system; and means for routing the data in the second protocol to particular storage devices among the plurality of storage devices.

According to yet another aspects, an IOM is provided for use within a network storage system. The IOM includes: a switching component configured to provide top-of-rack (TOR) switching for data to be routed from input connectors to one or more storage devices within a rack enclosure; and a protocol interface configured to convert a protocol of the data from an input data protocol to a protocol for use with the one of more storage devices within the rack enclosure. Among other features, this configuration may allow switching to be dis-aggregated from a TOR switch and distributed throughout the data network of the rack.

In some aspects, the switching component and the protocol interface are configured for use with one or more of Ethernet, Fibre Channel and InfiniBand. The one or more storage devices may include, for example, protocol-specific storage components (such as Ethernet attached storage, Fibre Channel attached storage, or InfiniBand attached storage), servers, or switch attached components within the rack enclosure. In some aspects, the switching component includes: one or more high port count switches configured to provide the TOR switching; and one or more low port count switches configured for product connectivity.

In some aspects, a high port count switch comprises: a protocol-specific switch having a high port count connector for connecting to an input data pipe providing data channels in accordance with a particular protocol; a protocol-specific channel-to-high speed serial converter having high port count serial lane connectors for connecting to the protocol-specific switch; and a high speed serial switch having high port count serial lane connectors for connecting to the protocol-specific channel-to-high speed serial converter and to external downstream components. The protocol-specific channel-to-high speed serial converter comprises, in some examples, an Ethernet-to-nonvolatile memory express (NVMe) bridge, a Fibre Channel-to-NVMe bridge, or an InfiniBand-to-NVMe bridge. The high speed serial switch may be, for example, a Peripheral Component Interconnect Express (PCIe) switch. A baseboard management controller (BMC) may be connected to the protocol-specific switch of the high port count switch.

In some aspects, a low port count switch comprises: a protocol-specific switch having a low port count connector for connecting to an input data pipe providing data channels in accordance with a particular protocol; a protocol-specific channel-to-high speed serial converter having low port count serial lane connectors for connecting to the protocol-specific switch; and a high speed serial switch having low port count serial lane connectors for connecting to the protocol-specific channel-to-high speed serial converter and to external downstream components.

In some aspects, the protocol interface comprises a personality module configured as a mezzanine card that includes one or more mezzanine connectors. The mezzanine card may be configured, in some examples, for co-planar mounting to a printed circuit board assembly (PCBA) that includes the switching component of the IOM and, in other examples, for vertical mounting to the PCBA.

In some aspects, one or more servers, storage components, and switch-attached components are coupled to the IOM and coupled to one another. In some aspects, a plurality of IOMs are provided along with a plurality of servers.

In another aspect, a method is provided for use with an IOM of a network storage system. The method includes:

routing data through a switching component configured to provide TOR switching of the data to determine a particular device destination for the data within the network storage system; and routing the data through a protocol interface configured to convert a protocol of the data from an input data protocol to a protocol for use with the particular device destination of the data.

In some aspects of the method, the switching component and the protocol interface are configured for use with one or more of Ethernet, Fibre Channel and InfiniBand, and routing the data through the protocol interface is performed to convert a protocol of the data from a particular one of Ethernet, Fibre Channel and InfiniBand to a protocol for use with the particular device destination of the data, such as NVMe or PCIe.

In yet another aspect, an apparatus is provided for use within a network storage system, the apparatus comprising: means for routing data through a switching component of an IOM configured to provide TOR switching of the data to determine a particular device destination for the data within the network storage system; and means for routing the data through a protocol interface configured to convert a protocol of the data from an input data protocol to a protocol for use with the particular device destination of the data.

BRIEF DESCRIPTION OF THE DRAWINGS

FIG. 20 is a block diagram illustrating further aspects of an IOM for use within a network storage system.

DETAILED DESCRIPTION

The word "exemplary" or "embodiment" is used herein to mean "serving as an example, instance, or illustration." Any implementation or aspect described herein as "exemplary" or as an "embodiment" is not necessarily to be construed as preferred or advantageous over other aspects of the disclosure. Likewise, the term "aspects" does not require that all aspects of the disclosure include the discussed feature, advantage, or mode of operation.

Embodiments will now be described in detail with reference to the accompanying drawings. In the following description, numerous specific details are set forth in order to provide a thorough understanding of the aspects described herein. It will be apparent, however, to one skilled in the art, that these and other aspects may be practiced without some or all of these specific details. In addition, well known steps in a method of a process may be omitted from flow diagrams presented herein in order not to obscure the aspects of the disclosure. Similarly, well known components in a device may be omitted from figures and descriptions thereof presented herein in order not to obscure the aspects of the disclosure.

Overview

Storage architectures for network storage systems often employ "top-of-rack" (TOR) switches, such as TOR Ethernet, Fibre Channel or InfiniBand switches.

Figure 1:
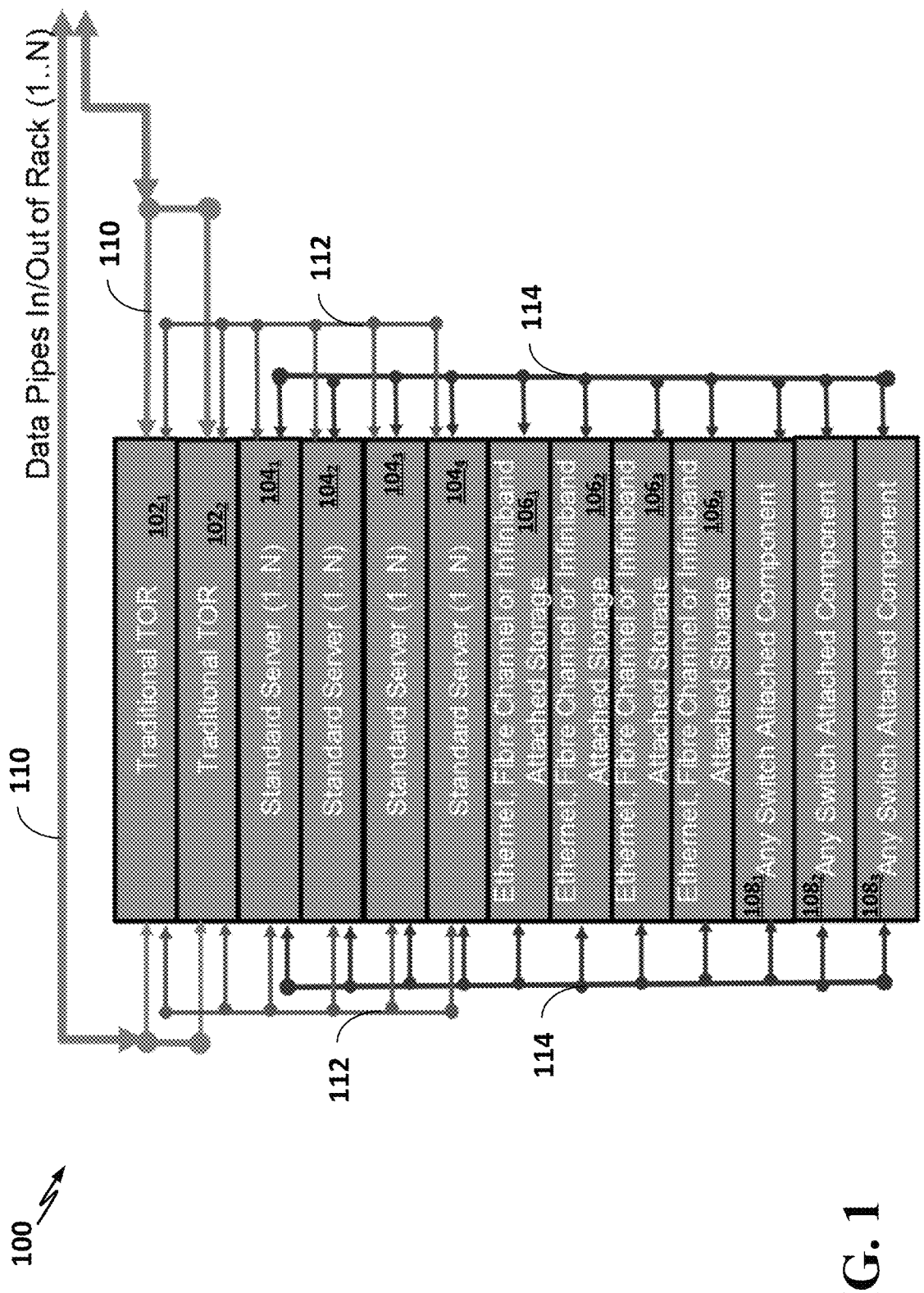
FIG. 1 illustrates a network storage system (rack) that includes top-of-rack (TOR) switches.

FIG. 1 illustrates a network storage system (or "rack") 100 that has TOR switches. Briefly, the network storage system 100 includes two traditional TOR switches $102_1$ and $102_2$, a set of standard servers $104_1$, $104_2$, $104_3$ and $104_4$, a set of attached storage components $106_1$, $106_2$, $106_3$ and $106_4$, (such as Ethernet attached storage, Fibre Channel attached storage, or InfiniBand attached storage), and a set of additional switch attached components $108_1$, $108_2$, and $108_3$. The attached storage devices $106_1$, $106_2$, $106_3$ and $106_4$ may be Network Attached Storage (NAS) devices such as NAS drives or NAS systems, which may be configured to act, e.g., as centralized network storage for use over a local network. NAS devices are often attached over a Local Area Network (LAN) using Ethernet but can be configured for use with other physical transports such as InfiniBand or Fibre Channel. The additional switch attached components $108_1$, $108_2$, and $108_3$ may be any other devices attached to the other components of the rack, such as routers or modems. Data pipes 110 are connected to the TOR switches $102_1$ and $102_2$ to provide input/output from the network storage system 100. The TOR switches $102_1$ and $102_2$ are in turn connected to one another and to the standard servers $104_1$, $104_2$, $104_3$ and $104_4$ via intermediate lines 112. The standard servers $104_1$, $104_2$, $104_3$ and $104_4$ are in turn connected to one another and to attached storage components $106_1$, $106_2$, $106_3$ and $106_4$, and to the additional switch attached components $108_1$, $108_2$, and $108_3$ the via lines 114. With this arrangement, three data paths or pipes (110, 112, and 114) are provided.

In accordance with aspects of the present disclosure, network storage architectures are provided wherein the functionality of the TOR switch is moved into an input/output (I/O) module (IOM) of the system. Aspects of the present disclosure cover Fibre Channel, InfiniBand and Ethernet switching. Exemplary IOMs described herein provide both the protocol interface for the back-end media devices within the enclosure (e.g., IOM functionality) and TOR switch functionality as well. This configuration allows switching to be dis-aggregated from the TOR switch and distributed throughout the data network of the rack. This, in turn, also allows for the reduction in size/quantity and/or removal of the TOR from the overall system. By "dis-aggregated" it is meant that, instead of providing a TOR that provides substantially all of the primary switching in the TOR, the switching is distributed among the data network components of the rack, using architectures and components described in detail below.

Aspects of the present disclosure cover both low port count and high port count systems. A low port count system is suited for expansion (or downstream) enclosures, where limited port counts are required. The high port count switches may be best suited for "Head" (or upstream) enclosures where the TOR functionality is being replaced. Both low and high port count switches can be used for optimal implementation of this solution.

Another aspect of the present disclosure is the capability to plug a mezzanine card onto the base IOM to make the carrier/switch board support any available device back end. The IOM supports high-speed switch (e.g., Fibre Channel, Ethernet of InfiniBand) connections from the switch to a connector system (e.g., mezzanine, back plane, card edge of the small outline dual in-line memory module (SODIMM) style) and a similar connector system that allows the card to interface to the system. The personality module functionality can be populated as a mezzanine style card using any of the connector systems noted above. The mezzanine connector system allows a personality module to be connected between the back end device interface and the front-end switch system. This essentially provides a configurable interface system that supports a protocol agnostic enclosure. A protocol agnostic enclosure that supports a configurable protocol based on the incorporation of a unique plug in personality module is thus provided for use within the enterprise storage space.

The personality module functionality can also be populated by hard soldering onto the carrier card assembly without the use of the mezzanine interface. In this approach, the functions of the personality module are still performed but not on a replaceable mezzanine card. In the hard soldered solution, the card is replaced to support other interfaces, but the dis-aggregated switch functionality noted above is maintained.

Aspects of the disclosure cover both single board and multiple board implementations to provide a configurable interface system that supports a protocol agnostic enclosure. An exemplary implementation described below incorporates multiple Ethernet to nonvolatile memory express (NVMe) bridge devices within the personality card function. Other implementations are described below as well. Aspects of the disclosure include connecting a baseboard management controller (BMC) to the switch directly, thus allowing all switch connected devices to access the BMC without a dedicated management port. Additional aspects of the disclosure relate to the population of a switch chip (e.g., Ethernet, Fibre Channel or InfiniBand) onto a Peripheral Component Interconnect Express (PCIe) plug in card. This applies to both industry standard form factors (e.g., half height, half length (HHHL), full height, half length (FHHL), full height, full length (FHFL), half height, full length (HHFL)) and non-industry standard form factors.

Notably, many of these aspects of the disclosure allow using the PCIe plug in card as a true switch, not a NIC (Network Interface Card). This differs from implementations intended to be host ports to provide data connections to a server or host device. Such implementations are typically connected to a PCIe bus and provide data to the host over that bus. Herein, instead, the switch card (in at least some examples) only obtains power from that PCIe slot. The switch operates as a stand-alone switch, primarily receiving power from the PCIe slot. No connections over the PCIe lanes are needed. Auxiliary data management connections may be made within the PCIe slot, but those auxiliary connections may be, e.g., for environmental management only.

Exemplary Systems and Methods

Figure 2:
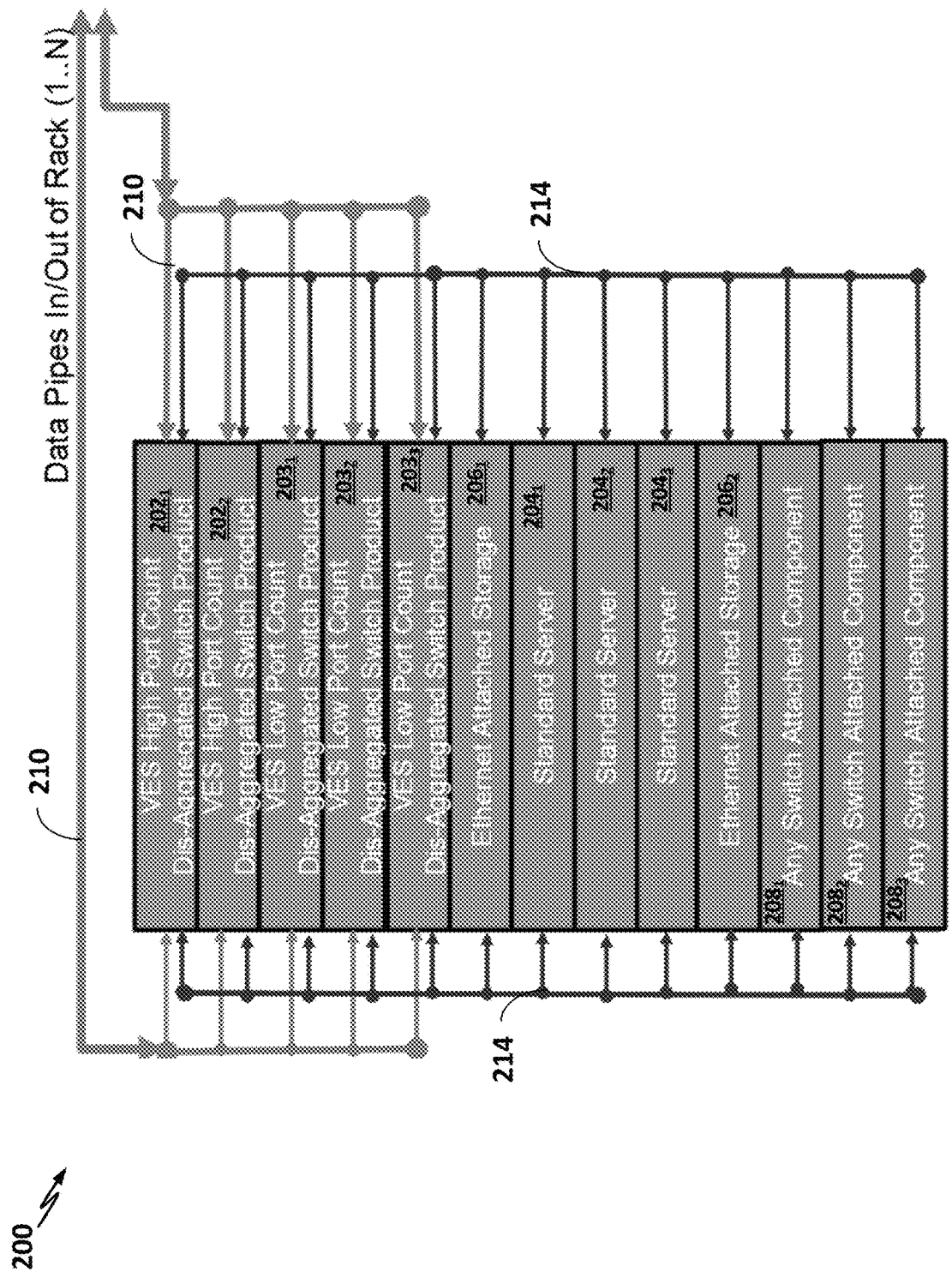
FIG. 2 illustrates a network storage system with an input/output module (IOM) configured for use with Ethernet to provide for dis-aggregated switching.

FIG. 2 illustrates a network storage system (rack) 200 with an IOM configured for use with Ethernet to provide for dis-aggregated switching. The network storage system 200 includes, in this particular example, two high port count dis-aggregated switches $202_1$-$202_2$, three low port count dis-aggregated switches $203_1$-$203_3$, a set of standard servers $204_1$, $204_2$, and $204_3$, a pair of Ethernet attached storage components $206_1$ and $206_2$, and a set of additional switch attached components $208_1$, $208_2$, and $208_3$. Data pipes/paths 210 are connected to the dis-aggregated switches $202_1$-$202_2$ and $203_1$-$203_3$ to provide input/output from the network storage system 200. The dis-aggregated switches $202_1$-$202_2$ and $203_1$-$203_3$ are in turn connected via data paths/pipes 214 to one another and to the other components of the rack 200: the standard servers $204_1$, $204_2$, and $204_3$, the Ethernet attached storage components $206_1$ and $206_2$, and the additional switch attached components $208_1$, $208_2$, and $208_3$. With this configuration, two data paths/pipes (210 and 214) are provided (i.e., one fewer that the rack 100 of FIG. 1, which does not include dis-aggregated switches).

In the rack system 200 of FIG. 2, the dis-aggregated switches $202_1$-$202_2$ and $203_1$-$203_3$ incorporate Ethernet switching only. No separate Ethernet TOR switches are required. The high port count dis-aggregated switches $202_1$-$202_5$ thus replace the separate TOR Ethernet switches. The other switches of the rack 200 may be low port count switches used from product connectivity. Note that data pipes 210 provide the data In/Out for the rack 200. The data pipes 214 provide for data traffic internal to the rack (i.e., traffic among the various illustrated components). In contrast with the rack 100 of FIG. 1, which employs three data pipes/paths, the rack 200 employs only two data pipes/paths. Notably, whereas the rack 100 of FIG. 1 employs intermediate data pipes/paths 112 to couple the standard servers $104_1$, $104_2$, $104_3$ and $104_4$ to the other components of rack 100, the rack 200 can omit the intermediate data pipes/paths. The features illustrated in this figure and in the other figures described herein are merely illustrative. For example, the number of servers or other components shown in the figures are merely exemplary. Also, the number of TOR components of predecessor systems that can be replaced using the systems and architectures described herein are merely exemplary.

Figure 3:
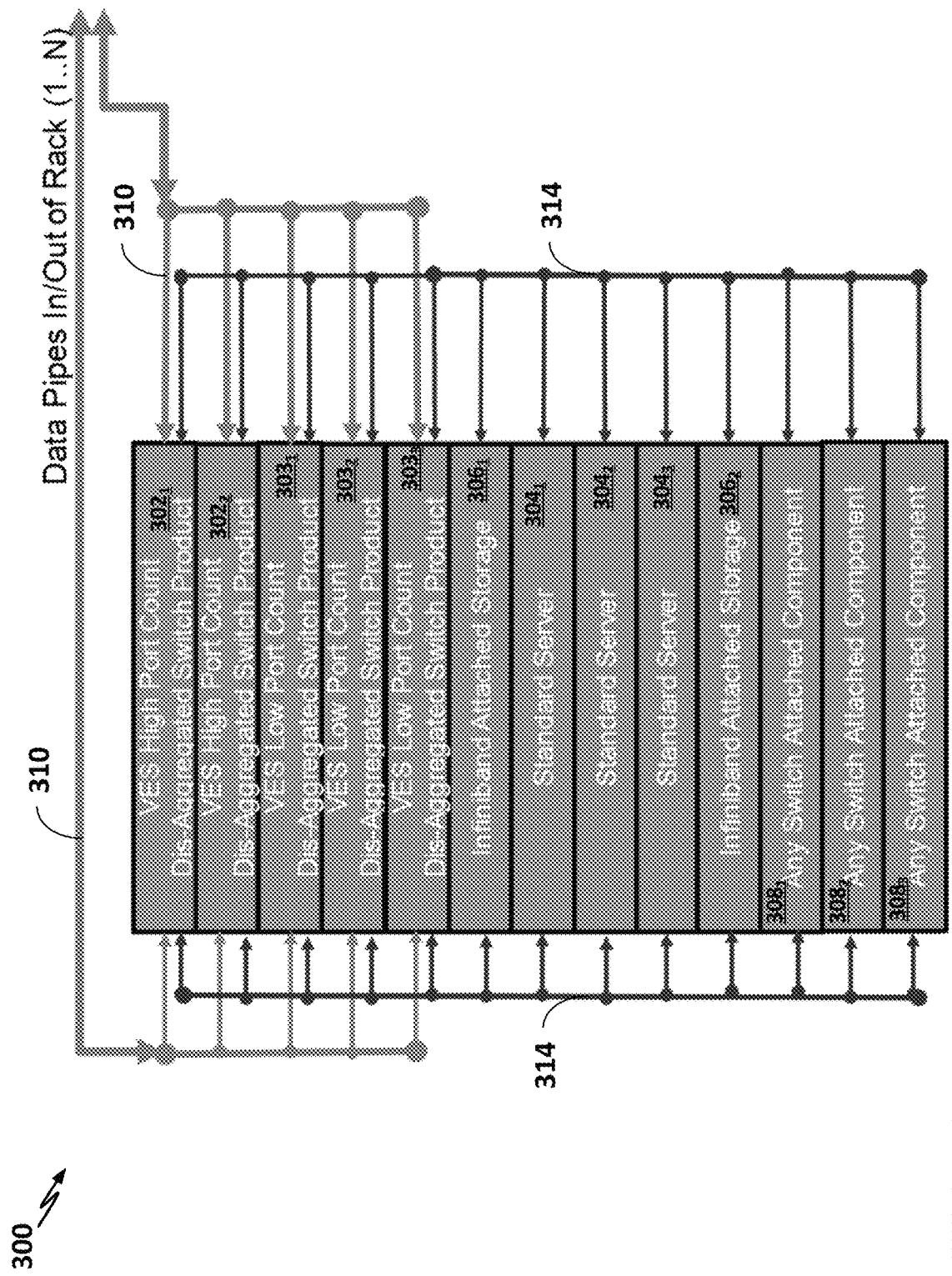
FIG. 3 illustrates a network storage system with an IOM configured for use with InfiniBand to provide for dis-aggregated switching.

FIG. 3 illustrates a network storage system (rack) 300 with an IOM configured for use with InfiniBand to provide for dis-aggregated switching. The network storage system 300 has an architecture similar to the architecture of network storage system 200 and hence will only briefly be described. The network storage system 300 includes, in this particular example, two high port count dis-aggregated switches $302_1$-$302_2$, three low port count dis-aggregated switches $303_1$-$303_3$, a set of standard servers $304_1$, $304_2$, and $304_3$, a pair of InfiniBand attached storage components $306_1$ and $306_2$, and a set of additional switch attached components $308_1$, $308_2$, and $308_3$. Data pipes/paths 310 to provide input/output from the network storage system 300. Data paths/pipes 314 provide coupling among the components of the rack 300. No separate InfiniBand TOR switches are required.

Figure 4:
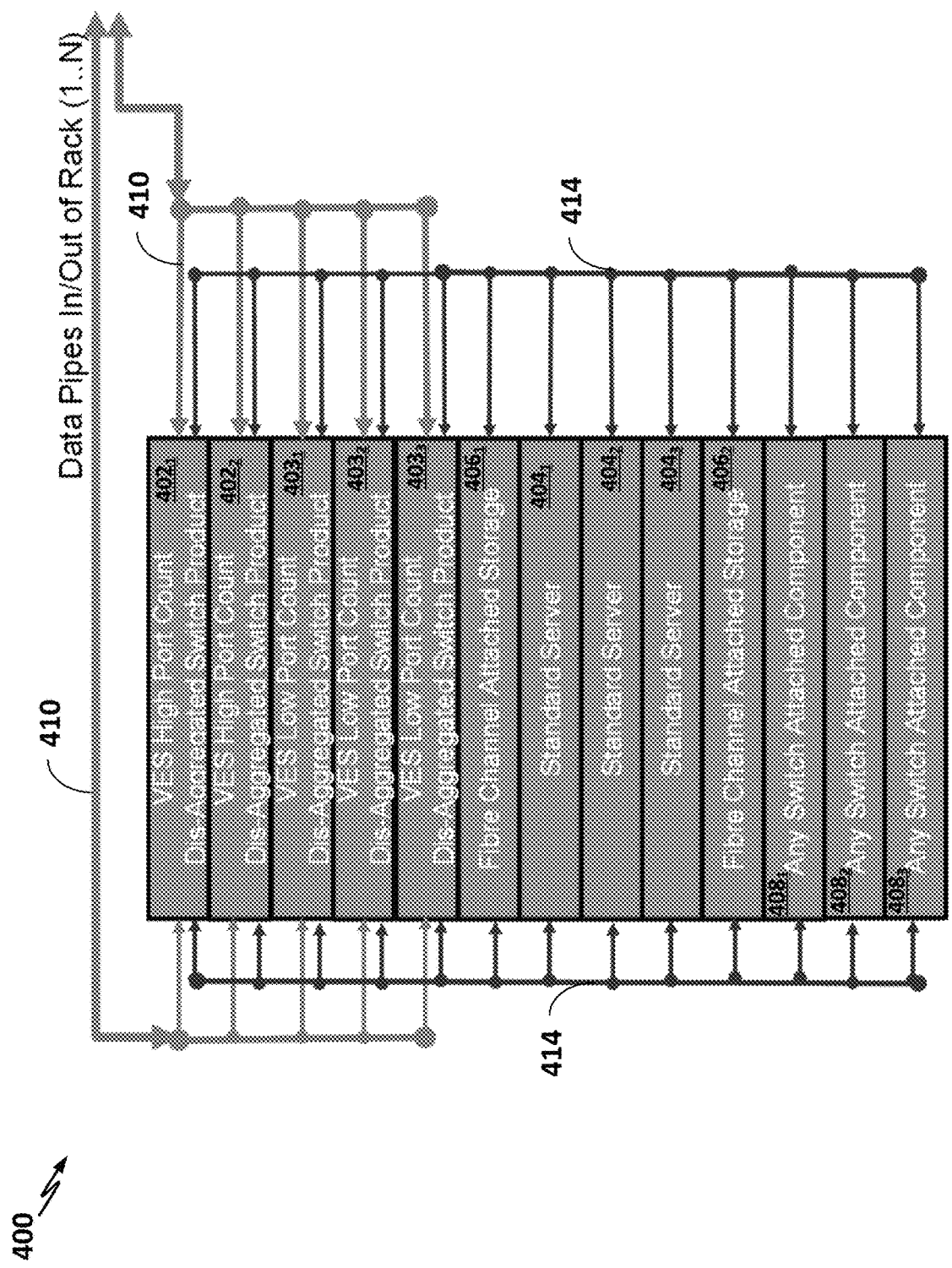
FIG. 4 illustrates a network storage system with an IOM configured for use with Fibre Channel to provide for dis-aggregated switching.

FIG. 4 illustrates a network storage system (rack) 400 with an IOM configured for use with Fibre Channel to provide for dis-aggregated switching. The network storage system 400 has an architecture similar to the architecture of network storage system 200 and hence will only briefly be described. The network storage system 400 includes, in this particular example, two high port count dis-aggregated switches $402_1$-$402_2$, three low port count dis-aggregated switches $403_1$-$403_3$, a set of standard servers $404_1$, $404_2$, and $404_3$, a pair of Fibre channel attached storage components $406_1$ and $406_2$, and a set of additional switch attached components $408_1$, $408_2$, and $408_3$. Data pipes/paths 410 to provide input/output from the network storage system 400. Data paths/pipes 414 provide coupling among the components of the rack 400.

Figure 5:
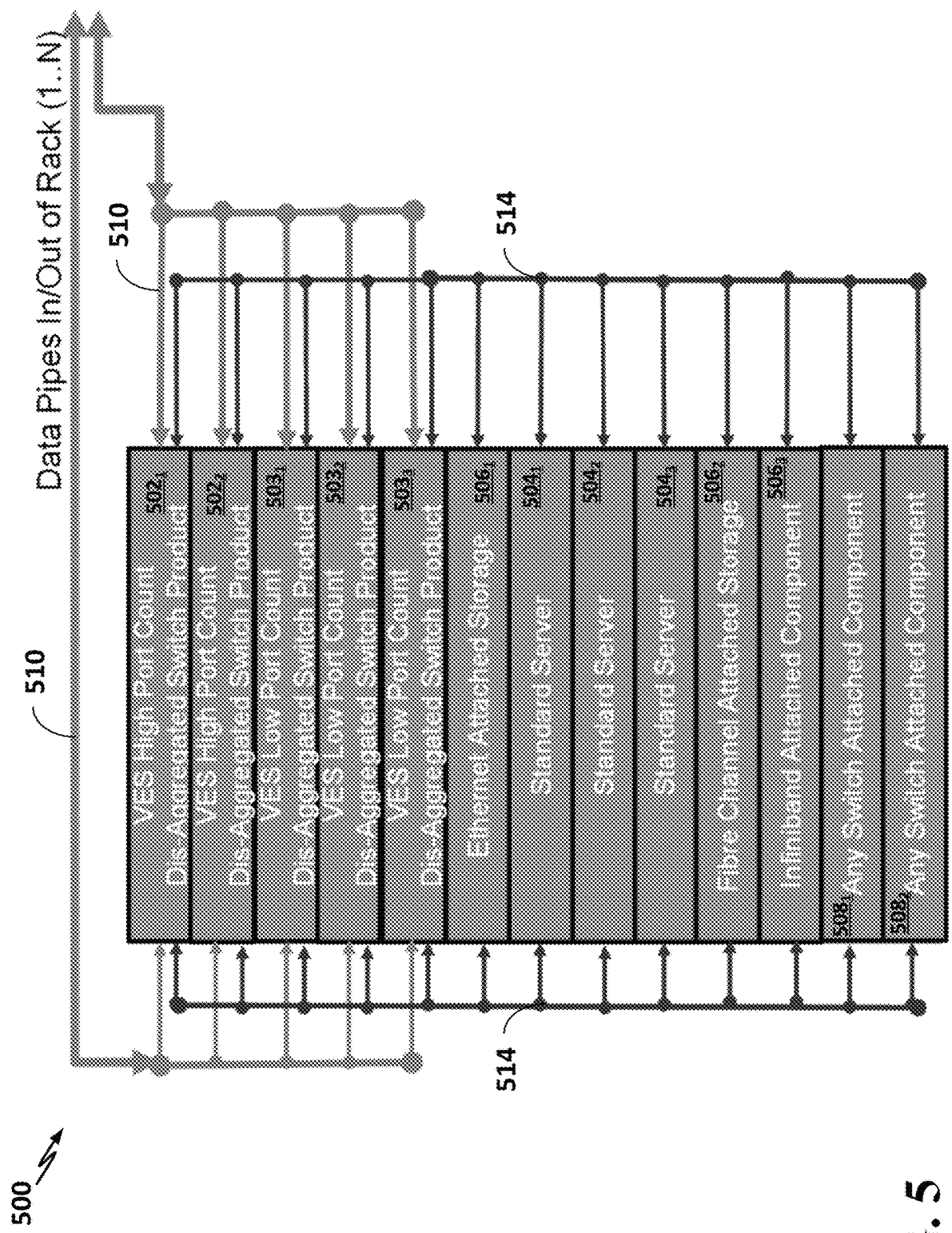
FIG. 5 illustrates a network storage system with an IOM configured for use with Ethernet, InfiniBand, and Fibre Channel to provide for dis-aggregated switching.

FIG. 5 illustrates a network storage system (rack) 500 with an IOM configured for use with Ethernet, InfiniBand, and Fibre Channel to provide for dis-aggregated switching. The network storage system 500 includes, in this particular example, two high port count dis-aggregated switches $502_1$-$502_2$, three low port count dis-aggregated switches $503_1$-$503_3$, a set of standard servers $504_1$, $504_2$, and $504_3$, an Ethernet attached storage component $506_1$, an InfiniBand attached storage component $506_2$, a Fibre channel attached storage component $506_3$, and a pair of additional switch attached components $508_1$ and $508_2$. Data pipes/paths 510 to provide input/output from the network storage system 500. Data paths/pipes 514 provide coupling among the components of the rack 500. In the rack 500 of FIG. 5, the dis-aggregated switches $502_1$-$502_2$ and $503_1$-$503_3$ incorporate Ethernet, Fibre Channel and/or InfiniBand Switching with multiple switches per IOM. No separate Ethernet, Fibre Channel and/or InfiniBand TOR switches are required.

Figure 6:
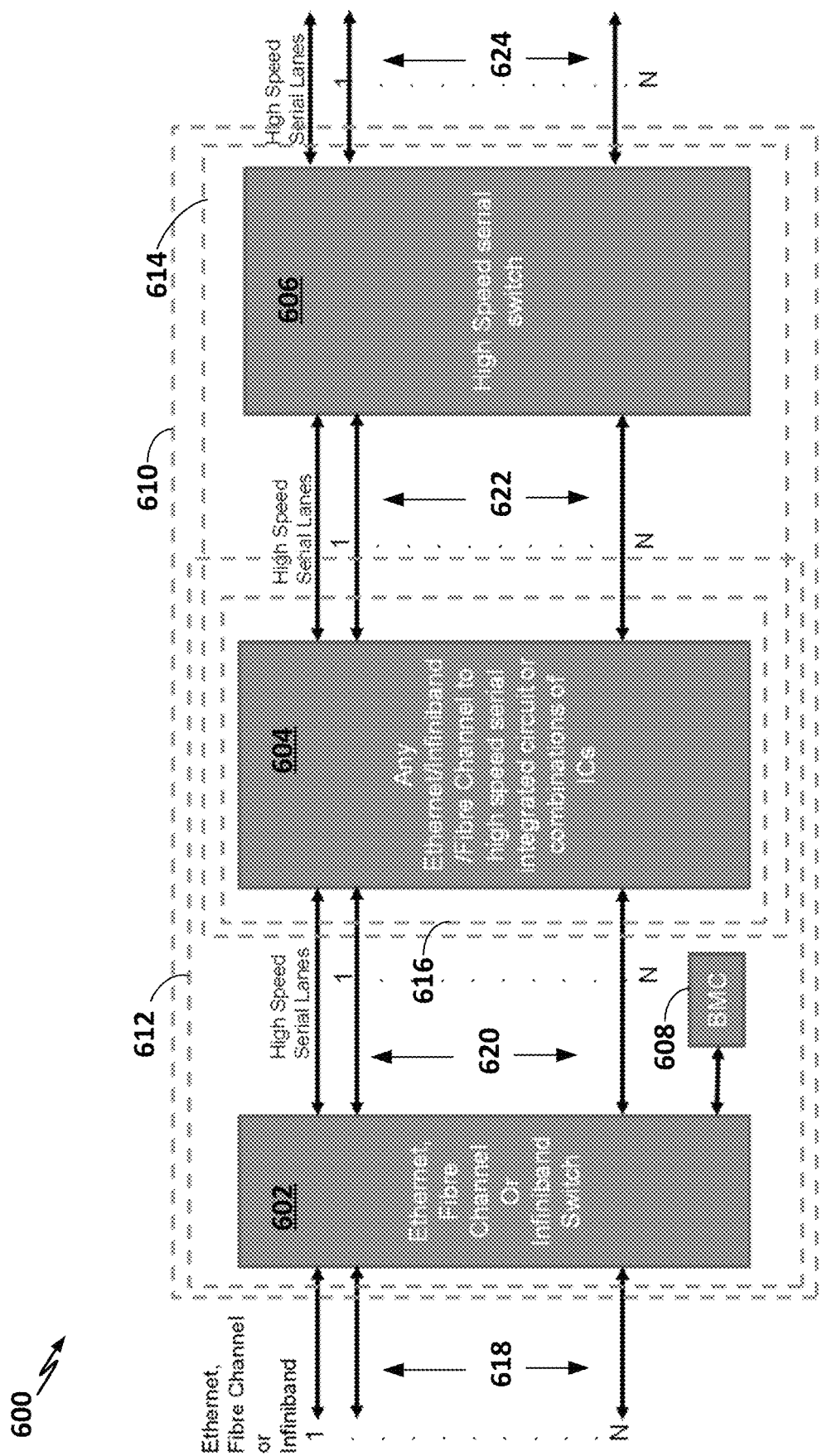
FIG. 6 is a block diagram of a general purpose switch card or fabric card incorporating features of the IOMs of FIGS. 2-5.

FIG. 6 is a block diagram of a general purpose switch card or fabric card 600 incorporating features of the IOMs of FIGS. 2-5, wherein a BMC is connected to the Ethernet/Fibre channel/InfiniBand switch directly, allowing all switch connected devices to access the BMC without a dedicated management port. The fabric card 600 includes an Ethernet/Fibre channel and/or InfiniBand switch 602, an Ethernet/InfiniBand/Fibre Channel-to-high speed serial integrated circuit 604 (which may be a combination of separate integrated circuits (ICs)), and a high speed serial switch 606. A BMC 608 is connected to the Ethernet/Fibre channel and/or InfiniBand switch 602. The connection of the BMC 608 to the switch 602 allows management to be performed over in-band high speed links instead of dedicated management ports. Note that the dashed boxes in FIG. 6 represent possible combinations for personality module circuitry incorporating the components. A first dashed box 610 corresponds to a configuration for personality module circuitry that collectively incorporates each of the illustrated switch and circuit components. A second dashed box 612 corresponds to a configuration for personality module circuitry that incorporates the switch 602, the integrated circuit 604, and the BMC 608 but excludes the high speed serial switch 606. A third dashed box 614 corresponds to a configuration for personality module circuitry that incorporates integrated circuit 604, the BMC 608, and the high speed serial switch 606 but excludes the switch 602. A fourth dashed box 616 corresponds to a configuration for personality module circuitry that incorporates just the integrated circuit 604.

FIG. 6 also illustrates exemplary data transfer data pipes or paths (each have N total lanes). A set of N Ethernet/Fibre channel and/or InfiniBand lanes 618 connect the Ethernet/Fibre channel and/or InfiniBand switch 602 to external upstream components. A set of N high speed serial lanes 620 connect switch 602 to IC 604. A set of N high speed serial lanes 622 connect IC 604 to high speed serial switch 606. A set of N high speed serial lanes 624 connect high speed serial switch 606 to external downstream components.

Figure 7:
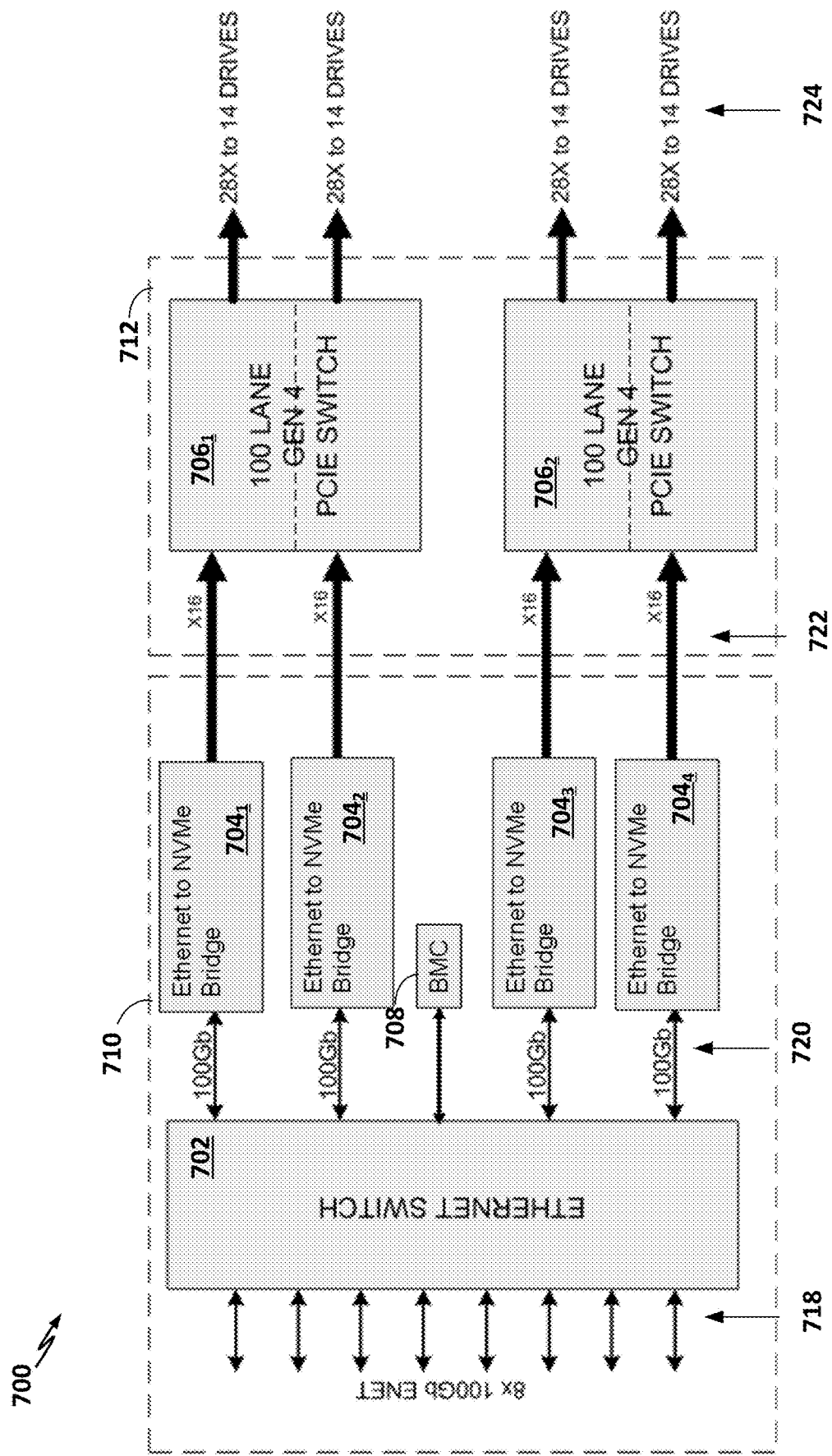
FIG. 7 is a block diagram of a low port count switch card or fabric card for an Ethernet example of the IOM.

FIG. 7 is a block diagram of a low port count switch card or fabric card 700 incorporating features of the general purpose IOM fabric card of FIG. 6 for an Ethernet example. The low port count device of FIG. 7 is well-suited for expansion (or downstream) enclosures, where limited port counts are required, and may be used as the low port count dis-aggregated switches $303_1$-$303_3$ of FIG. 3. The low port count fabric card 700 includes an Ethernet switch 702, a set of four Ethernet to NVMe bridges $704_1$-$704_4$, and a pair of 100 lane "generation 4" PCIe switches $706_1$-$706_2$. A BMC 708 is connected to the Ethernet switch 702. A dashed block 710 indicates that the Ethernet switch 702 and the set of four Ethernet to NVMe bridges $704_1$-$704_4$ may be configured as one device or chip set. Among other functions, the Ethernet switch 702 determines the particular downstream device (e.g., a particular storage drive) for receiving particular portions of input data (e.g., particular data packets) and routes those particular portions of the data to the downstream device. Since the various storage drives are connected to the Ethernet switch 702 via different bridges $704_1$-$704_4$, the Ethernet switch 702 determines, as part of its processing, which particular bridge to route particular portions (packets) of the data through. Hence, among other features, the Ethernet switch 702 provides a means for receiving input data in a first protocol from a plurality of input connectors and for determining particular means for bridging from among a plurality of means for bridging to receive particular portions of the input data. A dashed block 712 indicates that the PCIe switches $706_1$-$706_2$ may be configured as another separate device or chip set. FIG. 7 also illustrates exemplary data transfer data pipes or paths. A set of eight 100 gigabit (Gb) Ethernet lanes 718 connect the Ethernet switch 702 to external upstream components. A set of four 100 Gb lanes 720 connect switch 702 to the NVMe bridges $704_1$-$704_4$. A set of four ×16 lanes 722 connect NVMe bridges $704_1$-$704_4$ to the two PCIe switches $706_1$-$706_2$. A set of four 28× lanes 724 connect the two PCIe switches $706_1$-$706_2$ to external downstream components. In the particular example of FIG. 7, each of the lanes 724 can be coupled to fourteen drives. A similar configuration as shown in FIG. 7 can be provided for use with InfiniBand or Fibre Channel. Note that the switches $706_1$-$706_2$ need not be generation 4 PCIe switches, but other generations, e.g., generation 5 and beyond, or other, non-PCIe switches.

Figure 8:
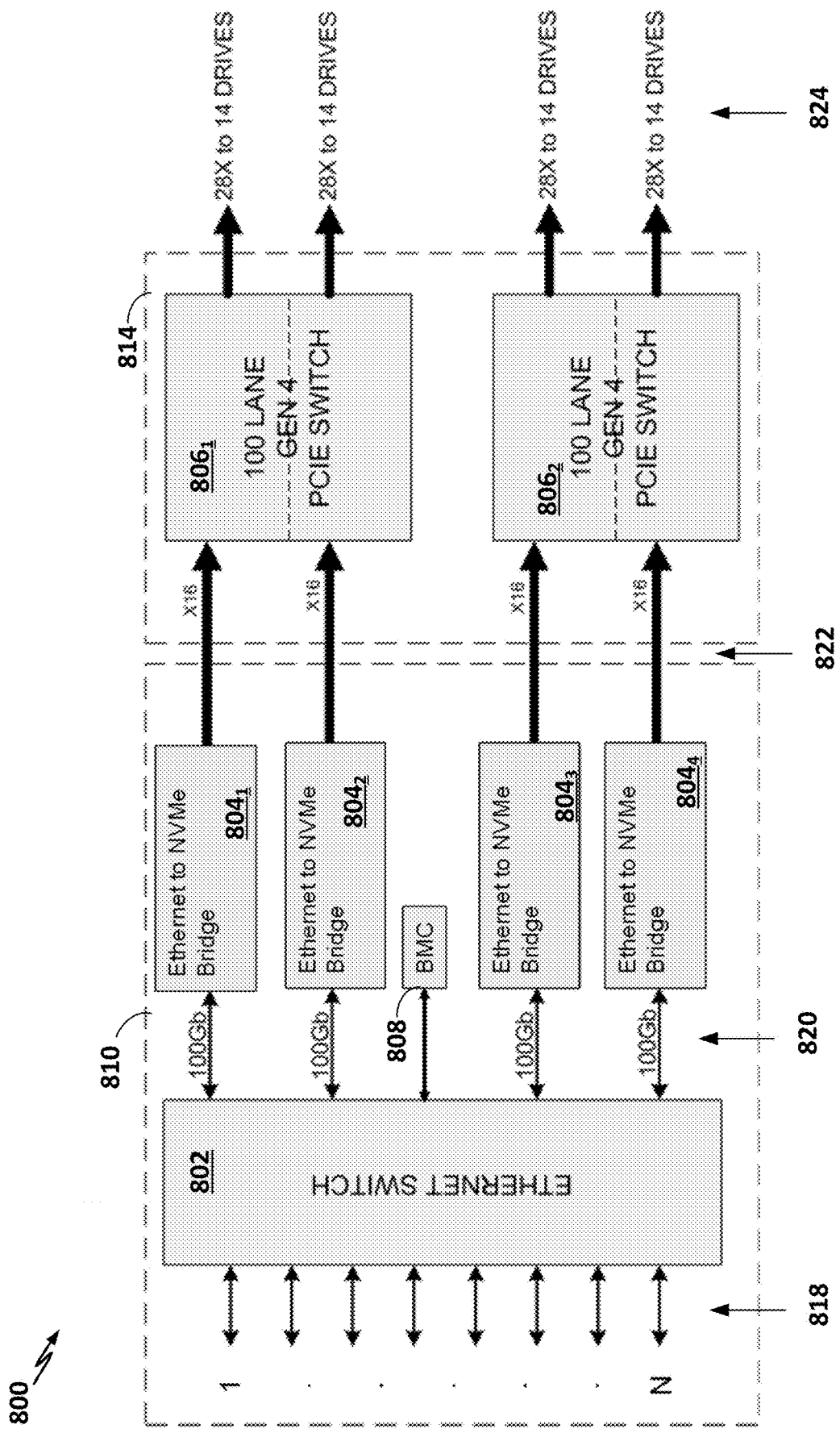
FIG. 8 is a beck block diagram of a high port count switch card or fabric card for an Ethernet example of the IOM.

FIG. 8 is a block diagram of a high port count switch card or fabric card 800 incorporating features of the general purpose fabric card of FIG. 6 for an Ethernet example. The high port count device of FIG. 8 is well-suited for Head (or upstream) enclosures, where the TOR functionality is being replaced, and may be used as the high port count dis-aggregated switches 302₁-302₂ of FIG. 3. (Both low and high port count switches may be used in overall systems as shown in FIG. 3) The high port fabric card 800 includes an Ethernet switch 802, a set of four Ethernet to NVMe bridges 804₁-804₄, and a pair of 100 lane "generation 4" PCIe switches 806₁-806₂. A BMC 808 is connected to the Ethernet switch 802. A dashed block 810 indicates that the Ethernet switch 802 and the set of Ethernet to NVMe bridges 804₁-804₄ may be configured as one device or chip set. A dashed block 812 indicates that the PCIe switches 806₁-806₂ may be configured as another separate device or chip set. FIG. 8 also illustrates exemplary data transfer data pipes or paths. A set of N 100 Gb Ethernet lanes 818 connect the Ethernet switch 802 to external upstream components. A set of four 100 Gb lanes 820 connect switch 802 to the NVMe bridges 804₁-804₄. A set of four ×16 lanes 822 connect NVMe bridges 804₁-804₄ to the two PCIe switches 806₁-806₂. A set of four 28× lanes 824 connect the two PCIe switches 806₁-806₂ to external downstream components. In the particular example of FIG. 8, each of the 28× lanes 824 can be coupled to fourteen NVMe drives. Thus, whereas the low port count example of FIG. 7 provides for eight connections into the Ethernet switch 702, the high port count example of FIG. 8 provides for N connections into the Ethernet switch 802 (where N can be any practical number but is typically substantially larger than 8 and, in some examples, may be 96). Note also that a BMC need not be provided and so, in some implementations, a device with all of the components of FIG. 8 may be provided while omitting the BMC or incorporating the BMC functionality into other components.

Figure 9:
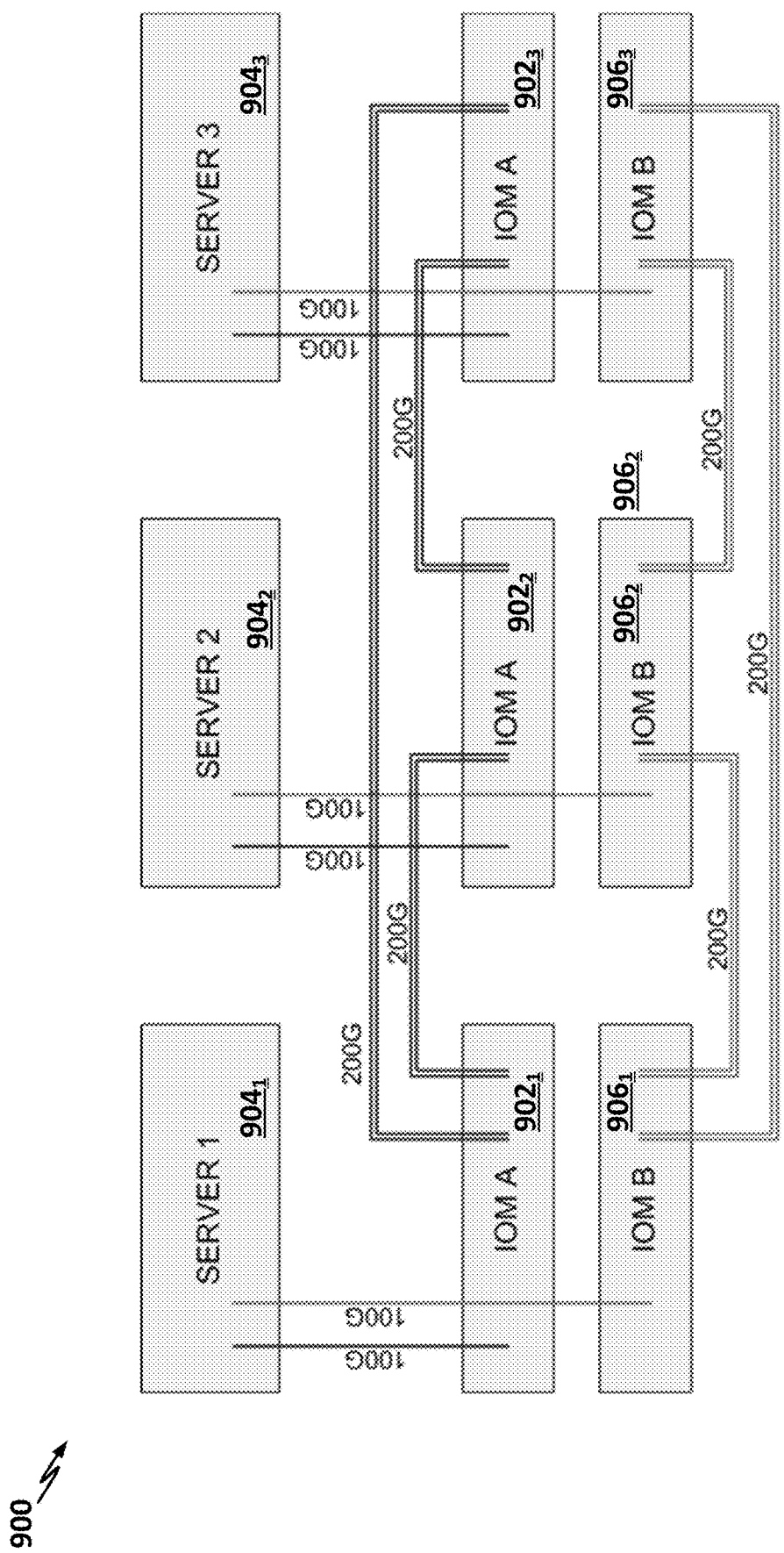
FIG. 9 illustrates a low port count system that includes six IOMs

FIG. 9 illustrates a low port count system 900 that includes six IOMs. Three of the IOMs, denoted IOM A 902₁-902₃, are connected to one another and to a set of three servers 904₁-904₃ via the various connection lines/paths shown in the figure. The other three of the IOMs, denoted IOM B 906₁-906₃, are connected to one another and to the set of three servers 904₁-904₃ via the various connection lines/paths shown in the figure, some of which are 100G connectors (where G is another designator for gigabit (Gb)) and others are 200G connectors, such as Ethernet connectors. This configuration provides for distributed switching while providing relatively low cost with enhanced resiliency. The configuration also eliminates the need for convention TOR switches, as discussed above.

As explained above, a mezzanine card may be plugged onto the base IOM of a system to enable a carrier/switch board to support any available device back end. The IOM may support high-speed switch (Fibre Channel, Ethernet of InfiniBand) connections from the switch to a connector system (mezzanine, back plane, card edge of SODIMM style) and a similar connector system that allows the card to interface to the system. This personality module functionality can be populated as a mezzanine style card using any of the connector systems described above. The mezzanine connector system thus allows a "personality module" to be connected between the back end device interface and the front-end switch system so as to provide a configurable interface system that supports a protocol agnostic enclosure. Note also that single board and multiple board implementations are provided (to provide the configurable interface system that supports the protocol agnostic enclosure).

Figure 10:
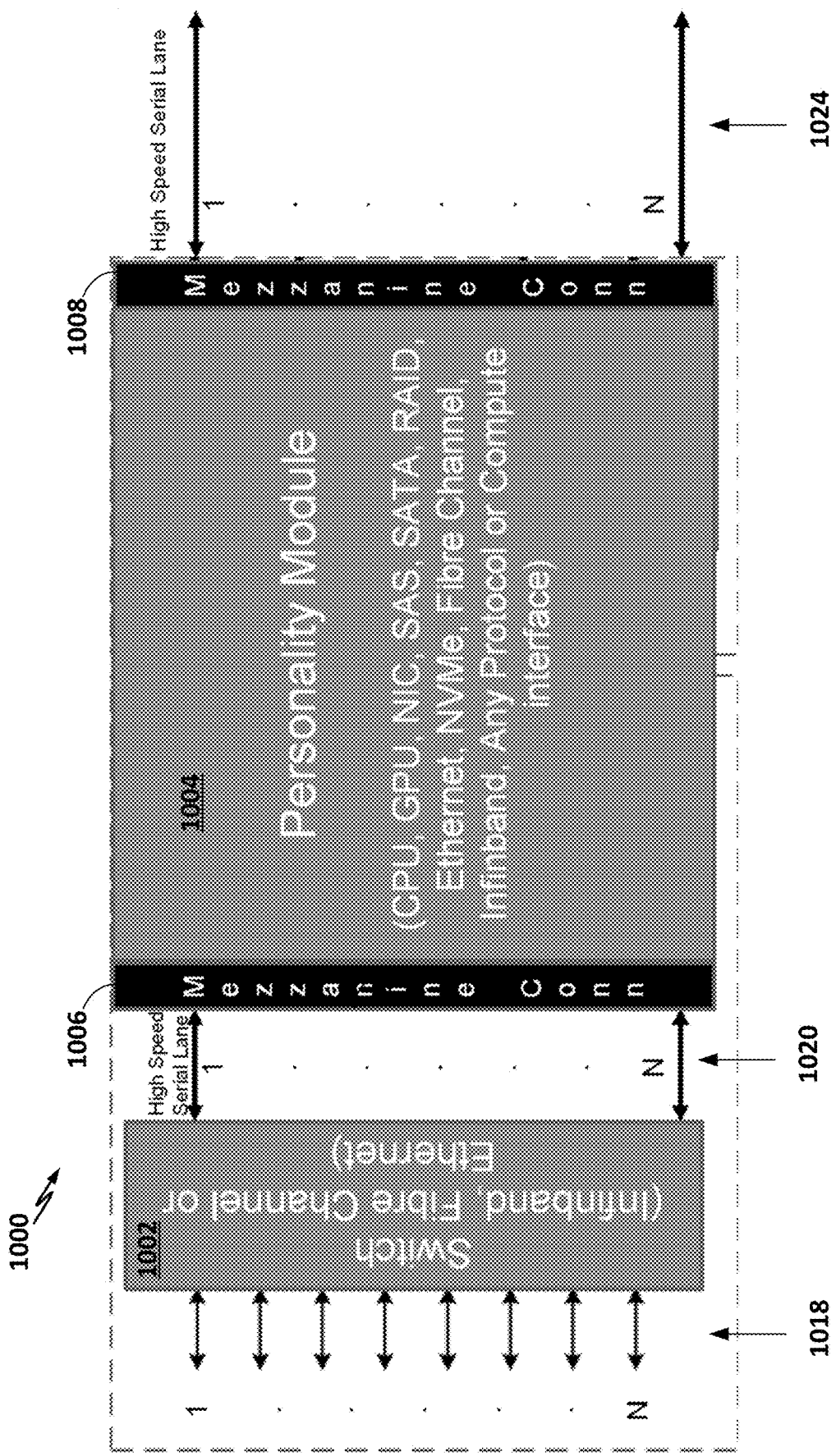
FIG. 10 illustrates an exemplary protocol agnostic IOM that includes a switch (e.g., Ethernet, InfiniBand, or Fibre Channel) and a personality module.

FIG. 10 illustrates a first exemplary protocol agnostic IOM 1000, which includes a switch (Ethernet, InfiniBand, or Fibre Channel) 1002 and a personality module 1004. The personality module 1004 may include, for example, various CPU, GPU, NIC, SAS, SATA, RAID, Ethernet, NVMe, Fibre Channel, InfiniBand, any protocol or compute interface components so as to provide a protocol agnostic system that can accommodate a wide variety of protocols). The personality module 1004 includes a first mezzanine connection 1006 for connecting the personality module 1004 to the switch 1002, and a second mezzanine connection 1008 for connecting the personality module 1004 to other components (not shown). As shown, the switch may have N ports 1018 for use as a host interface. The first mezzanine connection 1006 may accommodate an equal number of high speed serial lanes 1020 for connecting to the switch 1018. The second mezzanine connection 1008 may accommodate an equal number of high speed serial lanes 1024 for connecting to the other components (via, for example, a midplane/driveplane connector, discussed below). In this particular example, the switch fabric may be configured on an IOM PCBA (with the IOM PCBA shown in FIG. 12).

Figure 11:
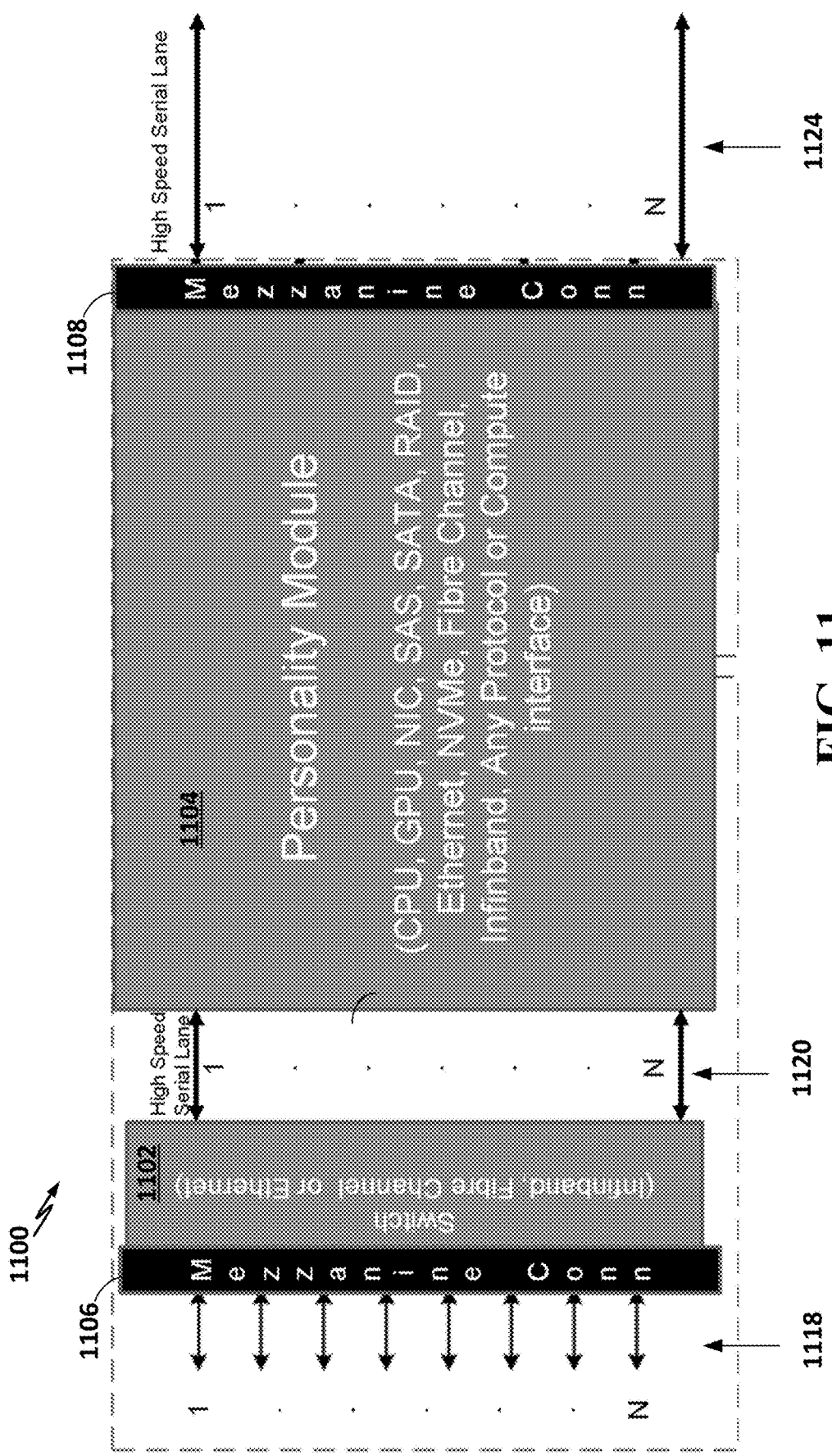
FIG. 11 illustrates another exemplary protocol agnostic IOM that includes a switch (e.g., Ethernet, InfiniBand, or Fibre Channel) and a personality module.

FIG. 11 illustrates a second exemplary protocol agnostic IOM 1100, which includes a switch (Ethernet, InfiniBand, or Fibre Channel) 1102 and a personality module 1104. The personality module 1104 may include, for example, various CPU, GPU, NIC, SAS, SATA, RAID, Ethernet, NVMe, Fibre Channel, InfiniBand, any protocol or compute interface components so as to provide a protocol agnostic system that can accommodate a wide variety of protocols). In this example, a first mezzanine connection 1106 is provided between the switch 1002 and its N connection lines 1118. A second mezzanine connection 1108 is provided on the personality module 1104 for connecting the personality module 1104 to other components (not shown). The personality module 1104 may accommodate an equal number of high speed serial lanes 1120 for connecting to the switch 1118. The second mezzanine connection 1108 may accommodate an equal number of high speed serial lanes 1124 for connecting to the other components. In this particular example, the switch fabric may be configured with switch circuitry on a personality module card (with the PM card shown in FIG. 12).

Figure 12:
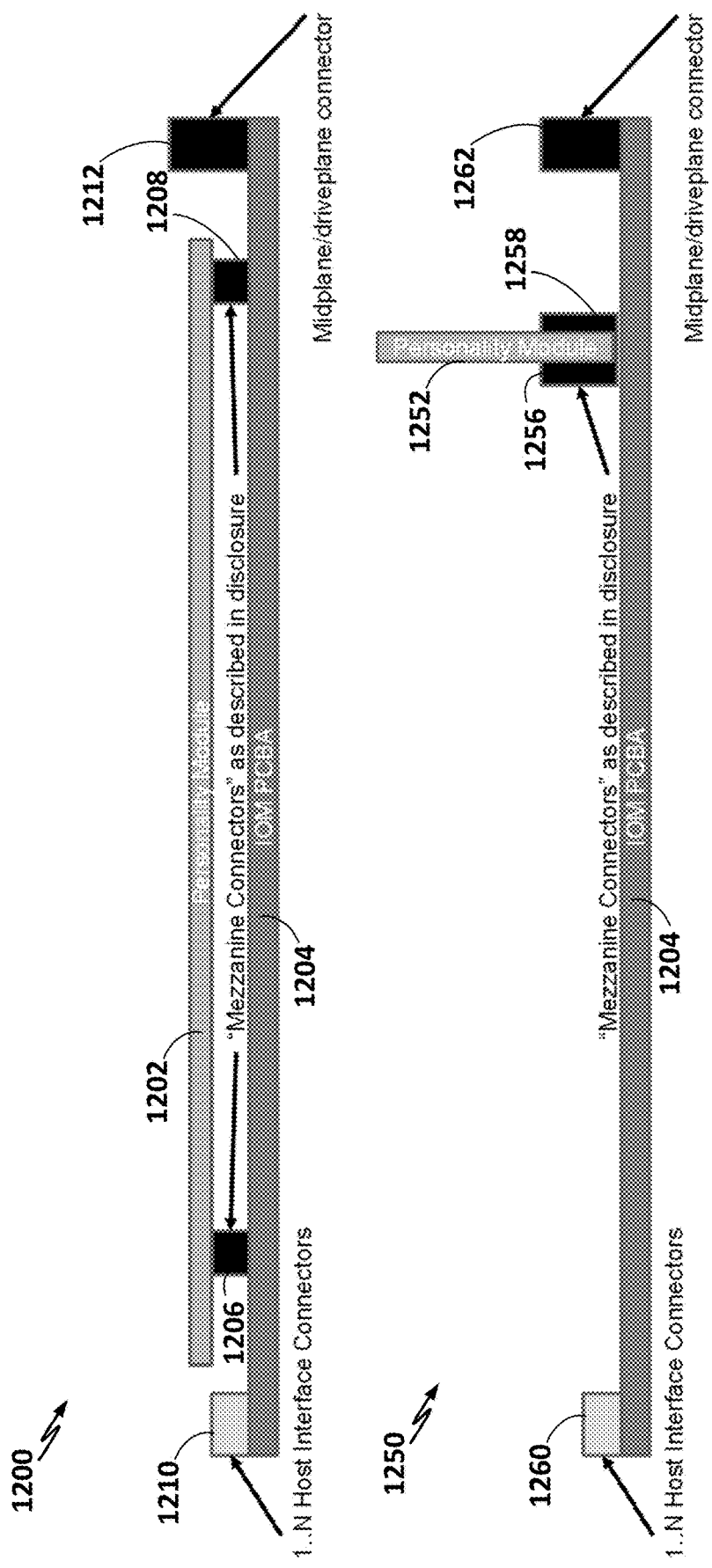
FIG. 12 illustrates a two examples of the physical structure of a protocol agnostic IOM that includes a personality module as in FIGS. 10 and 11.

FIG. 12 illustrates a two examples of the physical structure of a protocol agnostic IOM that includes a personality module as shown in FIGS. 10 and 11. In a first exemplary physical structure 1200, a personality module card 1202 is mounted co-planar with an IOM PCBA 1204 (i.e., mounted over the IOM PCBA and parallel with the IOM PCBA). A pair of mezzanine connectors 1206 and 1208 (e.g., connectors 1006 and 1008 of FIG. 10) connect the personality module card 1202 to the IOM PCBA 1204. A 1 . . . N host interface connector 1210 is provided on one end of the IOM PCBA 1204. A midplane/driveplane connector 1212 is provided at the other end of the IOM PCBA 1204, which may provide N high speed serial lanes (as shown in FIG. 10). In a second exemplary physical structure 1250, a personality module card 1252 is mounted perpendicular to an IOM PCBA 1254. A pair of mezzanine connectors 1256 and 1258 (e.g., connectors 1006 and 1008 of FIG. 10) connect opposing sides of the personality module card 1252 to the IOM PCBA 1254. A 1 . . . N host interface connector 1260 is again provided on one end of the IOM PCBA 1254. A midplane/driveplane connector 1262 is again provided at the other end of the IOM PCBA 1254, which may provide N high speed serial lanes (as shown in FIG. 10).

Figure 13:
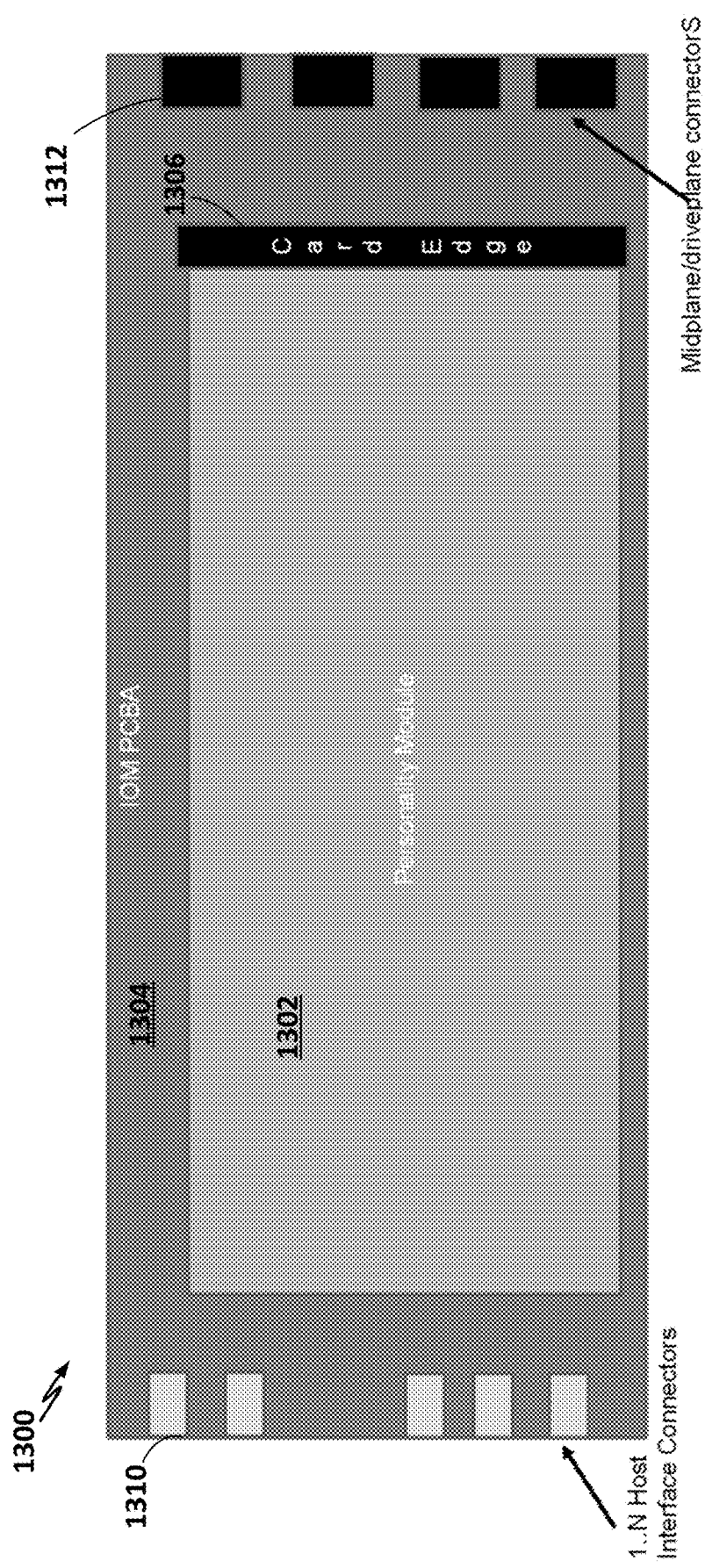
FIG. 13 illustrates a physical structure having a personality module card mounted co-planar with an IOM printed circuit board assembly (PCBA).

FIG. 13 illustrates another co-planar physical structure 1300 having a personality module card 1302 mounted co-planar with an IOM PCBA 1304. In this example, a card edge connector 1306 connects the personality module card 1302 to the IOM PCBA 1304. A 1 . . . N host interface connector 1310 is provided on one end of the IOM PCBA 1304. A midplane/driveplane connector 1312 is provided at the other end of the IOM PCBA 1304, which may provide N high speed serial lanes (as shown in FIGS. 10 and 12). In some examples, the card edge connector 1306 can be at a right angle with the personality module 1302 and mounted in space above the IOM PCBA 1304. In other examples, the card edge connector 1306 can be co-planar with the personality module card 1302 mounted in a cut out in the IOM PCBA 1304.

As discussed above, the switch chip (e.g., Ethernet, Fibre Channel or InfiniBand) may be populated onto a PCIe plug in card and may be used in connection with industry standard form factor (e.g., HHHL, FHHL, FHFL, HHFL) as well as non-industry standard form factors. The PCIe plug in card may be used a true switch, not a NIC (Network Interface Card). As noted, other implementations are often intended to be host ports to provide data connections to a server or host device and are typically connected to the PCIe bus to provide data to the host over that bus. In the devices of the next two figures, the switch card obtains its power from the PCIe slot. The switch thus operates as a stand-alone switch, primarily receiving power from the PCIe slot. No connections over the PCIe lanes are needed. Auxiliary data management connections may be made within the PCIe slot but (in at least some examples) the auxiliary data management connections are for environmental management only.

Figure 14:
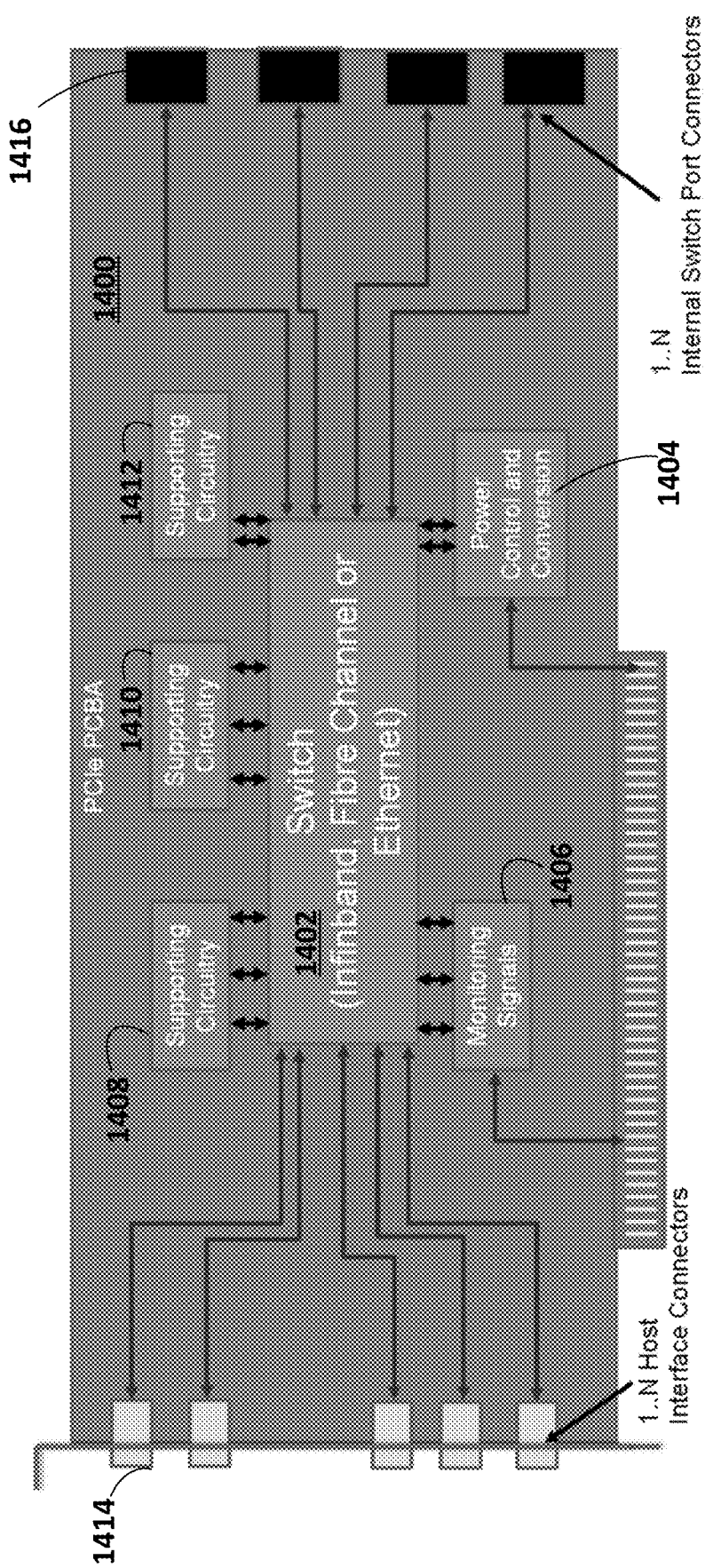
FIG. 14 illustrates an exemplary physical structure for a PCIe-based switch module PCBA.

FIG. 14 illustrates an exemplary physical structure for a PCIe-based switch module PCBA 1400. The switch module PCBA 1400 includes a switch 1402 (e.g., Ethernet, InfiniBand, or Fibre Channel) mounted in the center of the PCBA 1400, with various additional devices also mounted to the PCBA 1400. In this example, the additional devices include a power control and conversion device 1404, a monitoring device 1406 for monitoring signals, and supporting circuitry 1408, 1410, and 1412. Various interconnection lines are shown that connect the components to one another and to input/output connectors, including a set of 1 . . . N host connectors 1414 and a set of 1 . . . N internal switch port connectors 1416.

Figure 15:
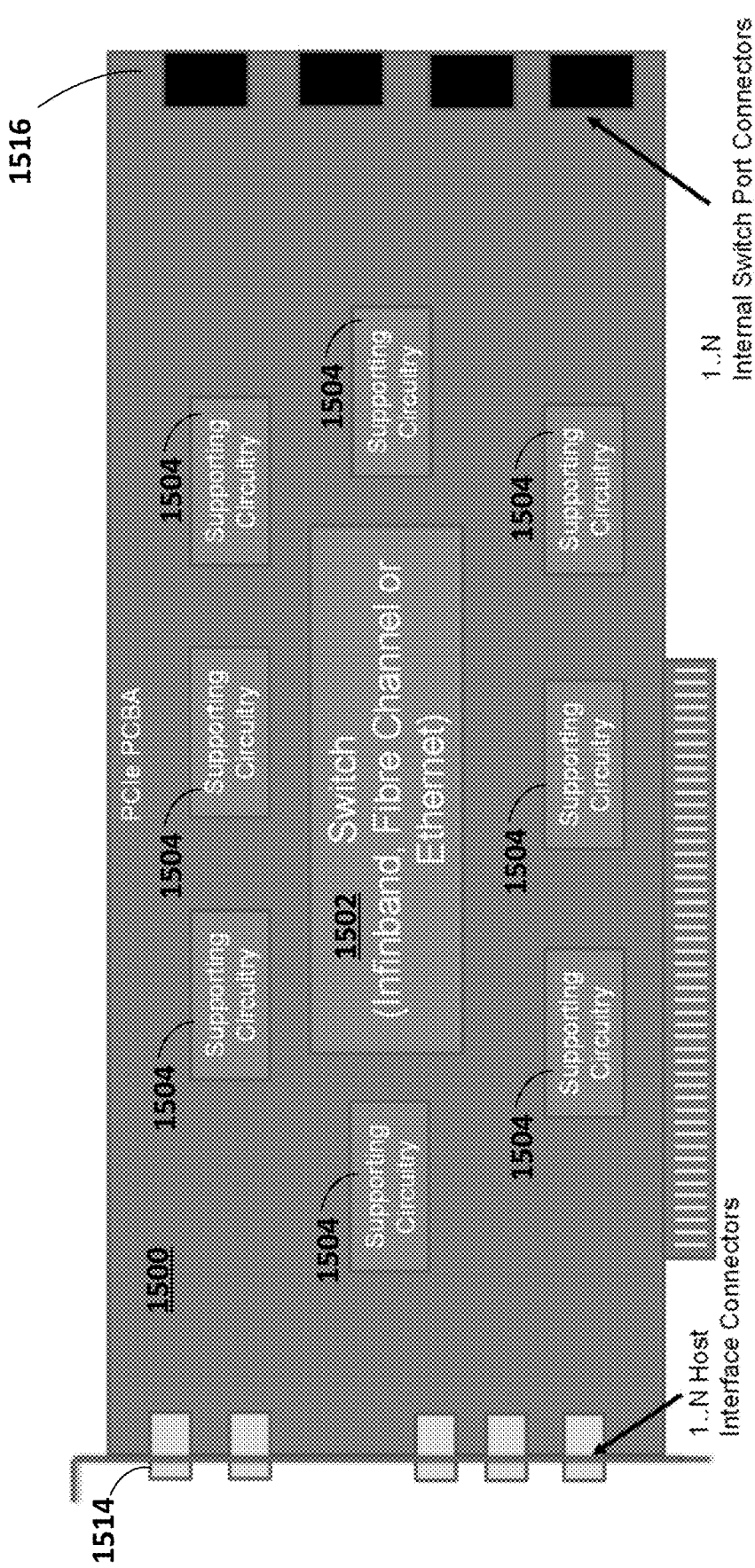
FIG. 15 illustrates another exemplary physical structure for a PCIe-based switch module PCBA.

FIG. 15 illustrates another exemplary physical structure for a PCIe-based switch module PCBA 1500. The switch module PCBA 1500 includes a switch 1502 (e.g., Ethernet, InfiniBand, or Fibre Channel) mounted in the center of the PCBA 1500, with various additional devices also mounted to the PCBA 1500. In this example, the additional devices are generally represented as supporting circuitry 1504. Interconnection lines are not shown in the illustration of FIG. 15, but similar connections as in FIG. 14 may be used to connect the various components to one another and to input/output connectors, including a set of 1 . . . N host connectors 1514 and a set of 1 . . . N internal switch port connectors 1516.

Figure 16:
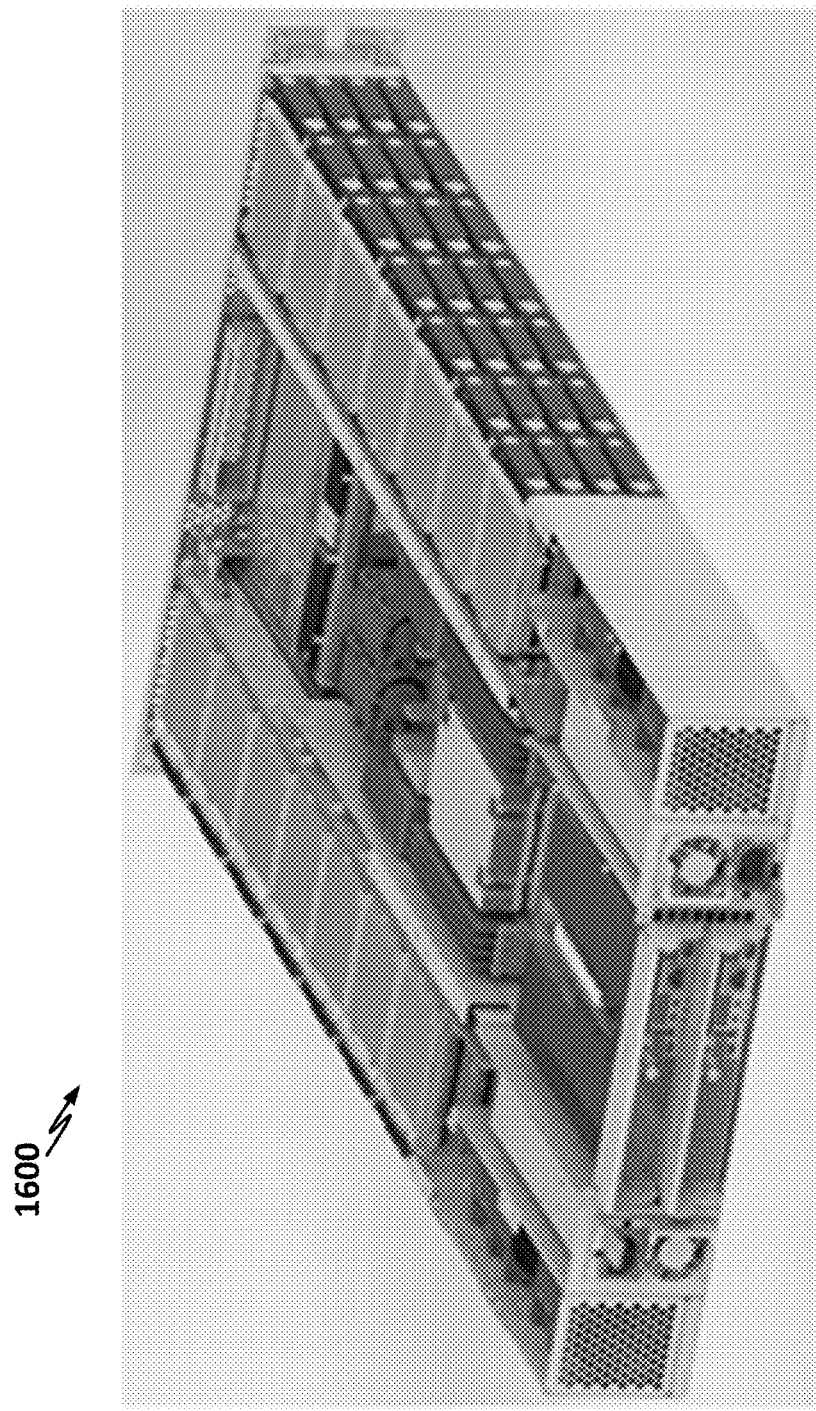
FIG. 16 is a perspective view of an exemplary embodiment of a fabric box with an integrated switch configured in accordance with features of FIGS. 2-15.

FIG. 16 is a perspective view of an exemplary embodiment of a fabric box 1600 with an integrated switch which may be configured in accordance with the various features of FIGS. 2-15, discussed above. Switch ports are integrated into the fabric modules. The device distributed switching through the rack system (not shown) it is installed in, and eliminates the need for a TOR switch (of the type shown in FIG. 1).

Additional Exemplary Embodiments

Figure 17:
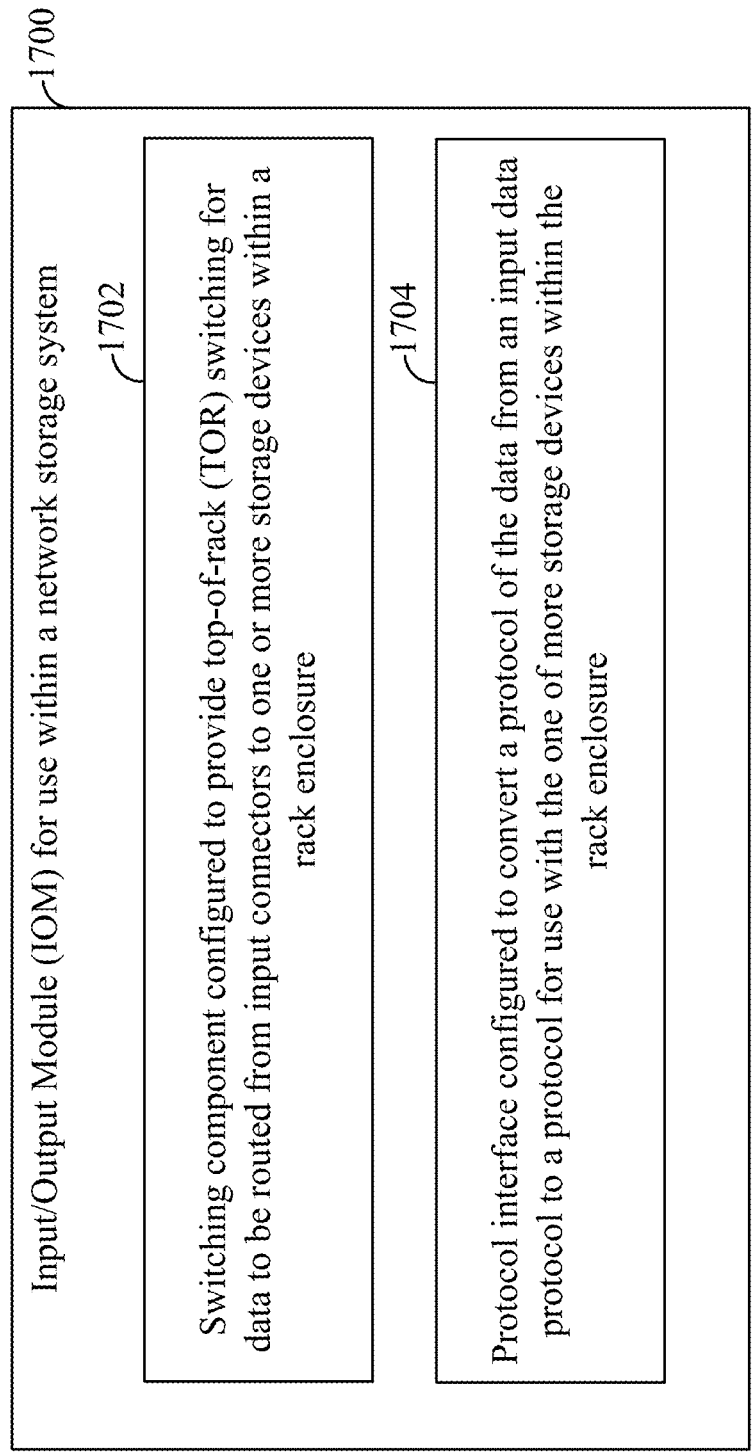
FIG. 17 is a block diagram illustrating an IOM for use within a network storage system.

FIG. 17 is a block diagram illustrating an IOM 1700 for use within a network storage system. The IOM 1700 includes a switching component 1702 configured to provide TOR switching for data to be routed from input connectors to one or more storage devices within a rack enclosure. The IOM 1700 also includes a protocol interface 1704 configured to convert a protocol of the data from an input data protocol to a protocol for use with the one of more storage devices within the rack enclosure. Examples of these components are described above in detail above with reference to FIGS. 1-16. As discussed in those examples, the network storage system may be a rack-based system wherein the various components of the system, including the IOM 1700 and the various storage devices, are mounted within the enclosure of the rack.

Figure 18:
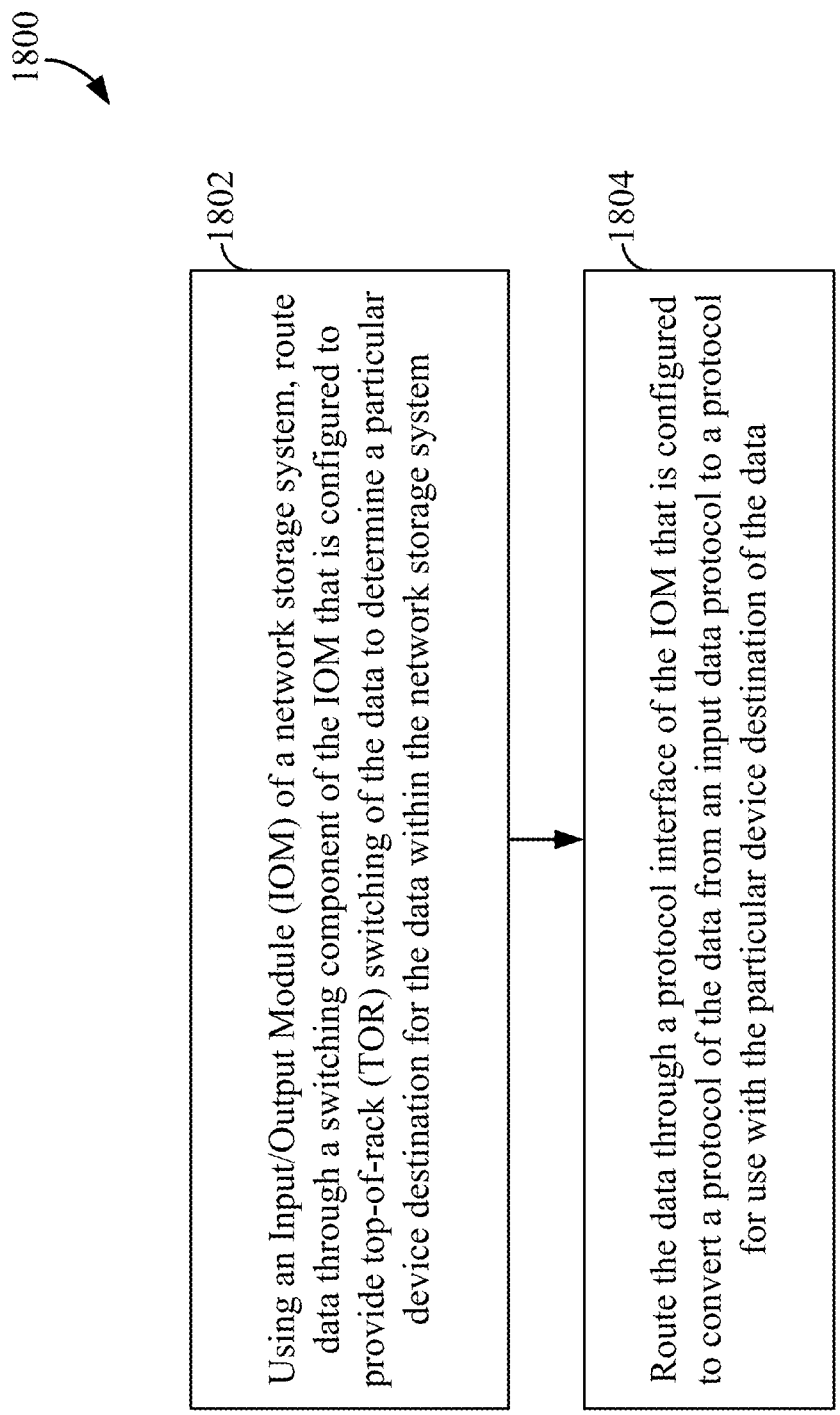
FIG. 18 is a flow chart illustrating a method performed by the IOM of FIG. 17.

FIG. 18 is a flow chart illustrating a method 1800 that may be performed by the IOM 1700 of FIG. 17 or other suitably-equipped systems, devices or apparatus. Briefly, at 1802, an IOM of a network storage system routes data through a switching component of the IOM that is configured to provide TOR switching of the data to determine a particular device destination for the data within the network storage system. At 1804, the IOM then routes the data through a protocol interface of the IOM that is configured to convert a protocol of the data from an input data protocol to a protocol for use with the particular device destination of the data. The switching component may be, for example, switching component 1702 of FIG. 17 and the protocol interface may be, for example, the protocol interface 1704 of FIG. 17. Examples of the operations of FIG. 18 are described in greater detail with reference to FIGS. 1-17.

Figure 19:
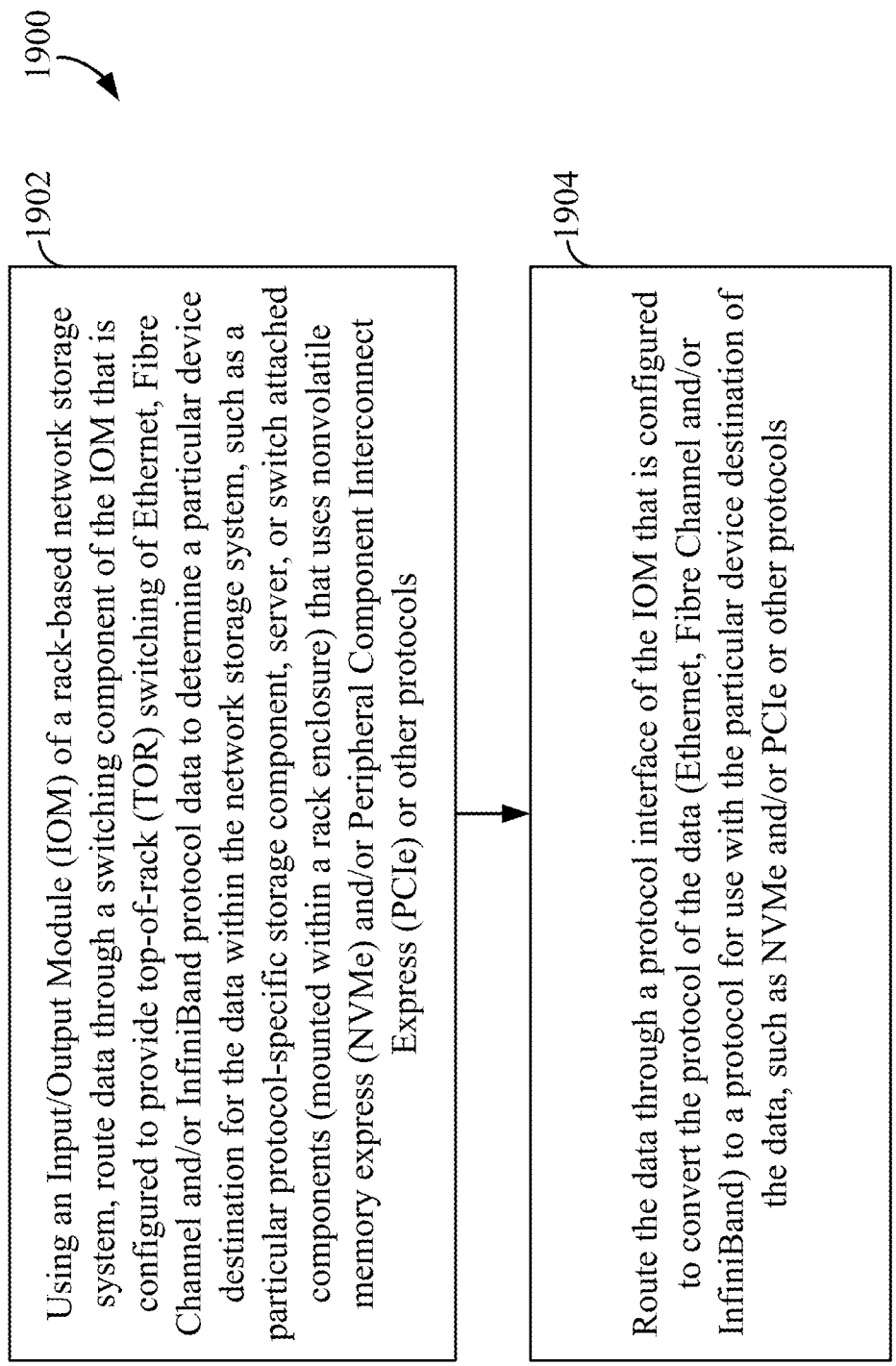
FIG. 19 is a flow chart further illustrating a method performed by the IOM of FIG. 17.

FIG. 19 is a flow chart further illustrating a method 1900 that may be performed by the IOM 1700 of FIG. 17 or other suitably-equipped systems, devices or apparatus. Briefly, at 1902, an IOM of a rack-based network storage system routes data through a switching component of the IOM that is configured to provide TOR switching of Ethernet, Fibre Channel and/or InfiniBand protocol data to determine a particular device destination for the data within the network storage system, such as a particular protocol-specific storage component, server, or switch attached components (mounted within a rack enclosure) that uses nonvolatile memory express (NVMe) and/or Peripheral Component Interconnect Express (PCIe) or other protocols. At 1904, the IOM routes data through a switching component of the IOM that is configured to provide TOR switching of the data to determine a particular device destination for the data within the network storage system. At 1804, the IOM then routes the data through a protocol interface of the IOM that is configured to convert the protocol of the data (Ethernet, Fibre Channel and/or InfiniBand) to a protocol for use with the particular device destination of the data, such as NVMe and/or PCIe or other protocols. The switching component may be, for example, switching component 1702 of FIG. 17 and the protocol interface may be, for example, the protocol interface 1704 of FIG. 17. Examples of the operations of FIG. 19 are described in detail above with reference to FIGS. 1-16.

FIG. 20 is a block diagram illustrating an IOM 2000 for use within a network storage system. The IOM 2000 includes a first switching component 2002 configured to receive input data from a plurality of input connectors for routing to a plurality of storage devices of the network storage system and further configured to determine particular bridge components from among a plurality of bridge components to receive particular portions of the input data. The IOM 2000 also includes a plurality of bridge components 2004 configured to receive data from the first switching component 2002 in a first protocol and convert the data to a second protocol for use with particular storage devices of the plurality of storage devices. The IOM 2000 also includes at least one second switching component 2006 configured to receive data in the second protocol from at least one of the plurality of bridge components 2004 for routing to particular storage devices among the plurality of storage devices. Examples of these components are described above in detail above with reference to FIGS. 1-16. As discussed in those examples, the network storage system may be a rack-based system wherein the various components of the system, including the IOM 2000 and the various storage devices, are mounted within the enclosure of the rack.

Figure 21:
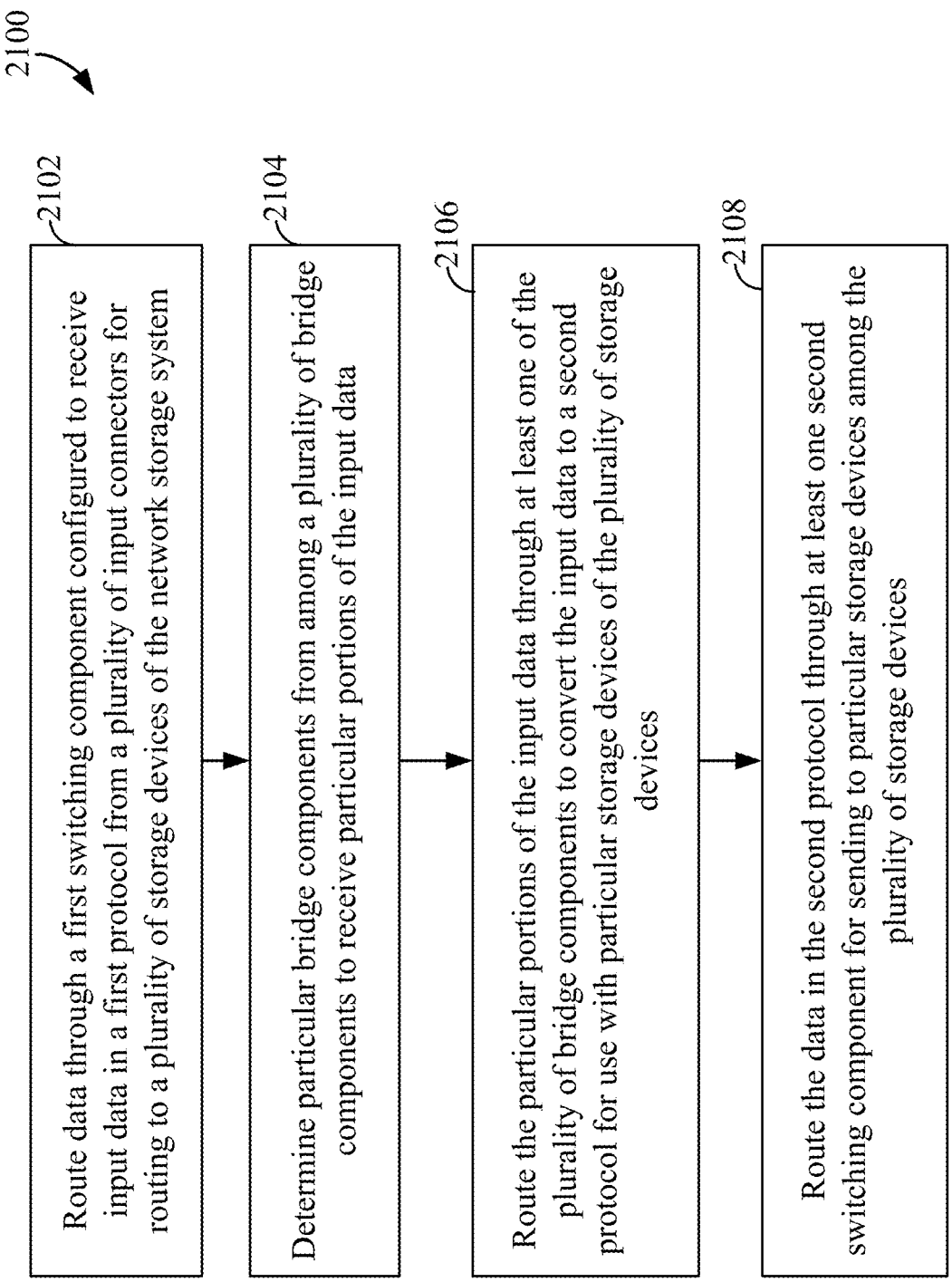
FIG. 21 is a flow chart illustrating a method performed by the IOM of FIG. 20.

FIG. 21 is a flow chart illustrating a method 2100 that may be performed by the IOM 2000 of FIG. 20 or other suitably-equipped systems, devices or apparatus. Briefly, at 2102, an IOM of a network storage system routes data through a first switching component of the IOM configured to receive input data in a first protocol from a plurality of input connectors for routing to a plurality of storage devices of the network storage system. At 2104, the IOM determines particular bridge components from among a plurality of bridge components to receive particular portions of the input data. At 2106, the IOM routes the particular portions of the input data through at least one of the plurality of bridge components to convert the input data to a second protocol for use with particular storage devices of the plurality of storage devices. At 2108, the IOM routes the data in the second protocol through at least one second switching component of the IOM for sending to particular storage devices among the plurality of storage devices. Examples of the operations of FIG. 21 are described in greater detail with reference to FIGS. 1-20.

As may be used herein, the term "operable to" or "configurable to" indicates that an element includes one or more of components, attachments, circuits, instructions, modules, data, input(s), output(s), etc., to perform one or more of the described or necessary corresponding functions and may further include inferred coupling to one or more other items to perform the described or necessary corresponding functions. As may also be used herein, the term(s) "coupled", "coupled to", "connected to" and/or "connecting" or "interconnecting" includes direct connection or link between nodes/devices and/or indirect connection between nodes/devices via an intervening item (e.g., an item includes, but is not limited to, a component, an element, a circuit, a module, a node, device, network element, etc.). As may further be used herein, inferred connections (i.e., where one element is connected to another element by inference) includes direct and indirect connection between two items in the same manner as "connected to". As may be used herein, the terms "substantially" and "approximately" provide an industry-accepted tolerance for its corresponding term and/or relativity between items.

The various features of the disclosure described herein can be implemented in different systems and devices without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

In the foregoing specification, certain representative aspects of the invention have been described with reference to specific examples. Various modifications and changes may be made, however, without departing from the scope of the present invention as set forth in the claims. The specification and figures are illustrative, rather than restrictive, and modifications are intended to be included within the scope of the present invention. Accordingly, the scope of the invention should be determined by the claims and their legal equivalents rather than by merely the examples described. For example, the components and/or elements recited in any apparatus claims may be assembled or otherwise operationally configured in a variety of permutations and are accordingly not limited to the specific configuration recited in the claims.

Furthermore, certain benefits, other advantages and solutions to problems have been described above with regard to particular embodiments; however, any benefit, advantage, solution to a problem, or any element that may cause any particular benefit, advantage, or solution to occur or to become more pronounced are not to be construed as critical, required, or essential features or components of any or all the claims.

As used herein, the terms "comprise," "comprises," "comprising," "having," "including," "includes" or any variation thereof, are intended to reference a nonexclusive inclusion, such that a process, method, article, composition or apparatus that comprises a list of elements does not include only those elements recited, but may also include other elements not expressly listed or inherent to such process, method, article, composition, or apparatus. Other combinations and/or modifications of the above-described structures, arrangements, applications, proportions, elements, materials, or components used in the practice of the present invention, in addition to those not specifically recited, may be varied or otherwise particularly adapted to specific environments, manufacturing specifications, design parameters, or other operating requirements without departing from the general principles of the same.

Moreover, reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is intended to be construed under the provisions of 35 U.S.C. § 112(f) as a "means-plus-function" type element, unless the element is expressly recited using the phrase "means for" or, in the case of a method claim, the element is recited using the phrase "step for."

What is claimed is:

1. An input/output module (IOM) configured for insertion into a mounting slot of a rack enclosure of a network storage system to mount the IOM within the rack enclosure, the IOM comprising:

an integrated device configured to provide top-of-rack (TOR) switching and protocol conversion and comprising:

a first switch to receive input data from a plurality of input connectors to route to a plurality of storage devices of the network storage system; and a plurality of bridges coupled to the first switch to receive data from the first switch in a first protocol and convert the data to one or more second protocols for use with particular storage devices of the plurality of storage devices;

wherein the first switch is configured to determine particular bridges from among the plurality of bridges to receive particular portions of the input data;

wherein each of the plurality of bridges is configured to output particular portions of the data in at least one of the second protocols for use with particular storage devices of the plurality of storage devices; and wherein the integrated device is configured to be enclosed within the rack enclosure while the IOM is inserted into the mounting slot of the rack enclosure.

2. The IOM of claim 1, wherein the first switch comprises a high port count switch to provide the top of rack (TOR) switching.

3. The IOM of claim 2, wherein the high port count switch comprises a switch having a number of input ports in the range of nine to ninety-six.

4. The IOM of claim 1, wherein the first switch comprises a low port count switch to provide product connectivity.

5. The IOM of claim 4, wherein the low port count switch comprises a switch having up to eight input ports.

6. The IOM of claim 1, wherein the first switch comprises one or more of an Ethernet switch, a Fibre Channel switch, and an InfiniBand switch.

7. The IOM of claim 6, wherein the plurality of bridges comprise one or more of an Ethernet-to-nonvolatile memory express (NVMe) bridge, a Fibre Channel-to-NVMe bridge, and an InfiniBand-to-NVMe bridge.

8. The IOM of claim 1, wherein the plurality of storage devices comprise: protocol-specific storage components, servers, or switch attached components within the rack enclosure.

9. The IOM of claim 1,
wherein the input connectors of the first switch connect to an input data pipe providing data channels in accordance with the first protocol; and
wherein at least one of the bridges comprises a high speed serial converter having serial lane connectors connected to the first switch.

10. The IOM of claim 1, comprising a plurality of the integrated devices, each providing at least some TOR switching functions, with TOR switching functionality distributed among the plurality of the integrated devices.

11. The IOM of claim 1, comprising a plurality of the integrated devices, with at least some of the devices being redundant devices sharing the same functionality, and with at least some of the devices having different functionality from the other devices of the plurality of the integrated devices.

12. The IOM of claim 1, wherein the integrated device comprises a chip set.

13. The IOM of claim 1, wherein the integrated device is mounted within a box that is enclosed within the rack enclosure while the IOM is mounted in the mounting slot of the rack enclosure.

14. An apparatus for insertion into a mounting slot of a rack enclosure of a network storage system, the apparatus comprising:
an integrated device configured to provide top-of-rack (TOR) switching and protocol conversion and comprising:
means for receiving input data in a first protocol from a plurality of input connectors and for determining particular means for bridging of the device from among a plurality of means for bridging of the device to receive particular portions of the input data;
wherein each of the means for bridging is configured for converting the data to one or more second protocols for use with particular storage devices of a plurality of storage devices of the network storage system; and
wherein each of the plurality of means for bridging is configured for outputting particular portions of the data in at least one of the second protocols for use with particular storage devices of the plurality of storage devices.

15. A network storage system comprising:
a plurality of servers;
a plurality of IOMs configured as in claim 1;
a first plurality of connectors coupling the plurality of IOMs to the plurality of servers using a first connection speed; and
a second plurality of connectors coupling the plurality of IOMs to one another using a second connection speed that is different from the first connection speed.

16. A system comprising:
a plurality of servers;
a first plurality of IOMs configured as in claim 1;
a first plurality of connectors coupling the first plurality of IOMs to the plurality of servers using a first connection speed;
a second plurality of connectors coupling the first plurality of IOMs to one another using a second connection speed that is different from the first connection speed;
a second plurality of IOMs configured as in claim 1;
a third plurality of connectors coupling the second plurality of IOMs to the plurality of servers using the first connection speed; and
a fourth plurality of connectors coupling the second plurality of IOMs to one another using the second connection speed.

* * * * *